(12) United States Patent
Terai

(10) Patent No.: US 11,545,214 B2
(45) Date of Patent: Jan. 3, 2023

(54) RESISTIVE MEMORY DEVICE

(71) Applicant: SAMSUNG ELECTRONICS CO., LTD., Suwon-si (KR)

(72) Inventor: Masayuki Terai, Seongnam-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 17/361,534

(22) Filed: Jun. 29, 2021

(65) Prior Publication Data
US 2022/0013171 A1 Jan. 13, 2022

(30) Foreign Application Priority Data

Jul. 8, 2020 (KR) .................. 10-2020-0084356
Dec. 14, 2020 (KR) .................. 10-2020-0174730

(51) Int. Cl.
*G11C 11/00* (2006.01)
*G11C 13/00* (2006.01)
*H01L 27/24* (2006.01)
*H01L 45/00* (2006.01)

(52) U.S. Cl.
CPC ...... *G11C 13/0028* (2013.01); *G11C 13/0004* (2013.01); *G11C 13/0026* (2013.01); *H01L 27/2427* (2013.01); *H01L 27/2463* (2013.01); *H01L 45/06* (2013.01); *H01L 45/122* (2013.01); *G11C 2213/72* (2013.01); *H01L 45/141* (2013.01); *H01L 45/1675* (2013.01)

(58) Field of Classification Search
CPC ............ G11C 13/0028; G11C 13/0004; G11C 13/0026; G11C 2213/72; H01L 27/2463; H01L 27/2427; H01L 45/06; H01L 45/122; H01L 45/141; H01L 45/1675
See application file for complete search history.

(56) References Cited

U.S. PATENT DOCUMENTS

| | | | |
|---|---|---|---|
| 6,878,614 B2* | 4/2005 | Sun | H01L 23/5258 438/467 |
| 7,394,680 B2 | 7/2008 | Toda et al. | |
| 7,808,811 B2* | 10/2010 | Park | G11C 13/00 365/63 |
| 7,920,408 B2 | 4/2011 | Azuma et al. | |
| 8,022,381 B2 | 9/2011 | Toda | |
| 8,274,068 B2 | 9/2012 | Nagashima | |
| 8,502,322 B2 | 8/2013 | Nitta | |

(Continued)

*Primary Examiner* — Viet Q Nguyen
(74) *Attorney, Agent, or Firm* — F. Chau & Associates, LLC

(57) ABSTRACT

A resistive memory device includes a first word line extending in a first horizontal direction, a second word line extending on the first word line in the first horizontal direction, a third word line extending on the second word line in the first horizontal direction, a first bit line extending between the first and second word lines in a second horizontal direction, a second bit line extending between the second and third word lines in the second horizontal direction, and memory cells respectively arranged between the first word line and the first bit line, between the first bit line and the second word line, between the second word line and the second bit line, and between the second bit line and the third word line. A thickness of the second word line is greater than a thickness of each of the first word line and the third word line.

20 Claims, 34 Drawing Sheets

(56) References Cited

U.S. PATENT DOCUMENTS

| | | | |
|---|---|---|---|
| 8,729,523 B2* | 5/2014 | Pio | H01L 27/10 |
| | | | 438/421 |
| 8,848,424 B2 | 9/2014 | Ikeda et al. | |
| 8,885,387 B2 | 11/2014 | Azuma et al. | |
| 8,895,437 B2* | 11/2014 | Cernea | H01L 45/1608 |
| | | | 365/185.23 |
| 9,064,547 B2* | 6/2015 | Cernea | H01L 27/2454 |
| 9,147,687 B2* | 9/2015 | Koh | H01L 27/11575 |
| 9,716,129 B1* | 7/2017 | Sim | H01L 45/1233 |
| 9,792,980 B2 | 10/2017 | Perner et al. | |
| 9,805,793 B2* | 10/2017 | Rajamohanan | G11C 13/0004 |
| 9,812,505 B2* | 11/2017 | Sakotsubo | H01L 27/2481 |
| 10,262,730 B1* | 4/2019 | Nardi | H01L 45/1253 |
| 10,263,038 B1* | 4/2019 | Iwamoto | H01L 45/12 |
| 10,825,863 B2* | 11/2020 | Redaelli | G11C 13/004 |
| 11,100,959 B2* | 8/2021 | Sim | H01L 27/2481 |
| 11,222,695 B2* | 1/2022 | Majumdar | H01L 27/222 |
| 2007/0132049 A1 | 6/2007 | Stipe | |
| 2009/0196091 A1 | 8/2009 | Kau et al. | |
| 2015/0084156 A1 | 3/2015 | Ravasio et al. | |
| 2019/0341545 A1 | 11/2019 | Yim et al. | |
| 2021/0210551 A1* | 7/2021 | Han | H01L 27/2454 |

* cited by examiner

RESISTIVE MEMORY DEVICE

CROSS-REFERENCE TO RELATED APPLICATIONS

This non-provisional U.S. patent application claims priority under 35 U.S.C. § 119 to Korean Patent Application No. 10-2020-0084356, filed on Jul. 8, 2020, and Korean Patent Application No. 10-2020-0174730, filed on Dec. 14, 2020, in the Korean Intellectual Property Office, the disclosures of which are incorporated by reference in their entireties herein.

1. TECHNICAL FIELD

The inventive concept relates to a memory device, and more particularly, to a resistive memory device having a cross-point array structure.

2. DISCUSSION OF RELATED ART

A resistive memory device includes several memory cells, where a value of a resistance of each memory cell represents a certain data state of the corresponding memory cell. Examples of a resistive memory device include a resistive random-access memory and phase-change memory.

In a resistive memory device having a three-dimensional cross-point stack structure, a memory cell is arranged at an intersection point between two electrodes that cross each other. The resistive memory device includes many drivers to support high speed access rates and a large storage capacity. However, the large number of drivers causes the resistive memory device to occupy a large area, thereby increasing manufacturing costs.

Thus, there is a need for a resistive memory device having a cross-point stack structure that occupies a smaller area.

SUMMARY

At least one embodiment of the inventive concept provides a resistive memory device having a structure for improving an integration degree, reducing manufacturing costs per bit, and securing enough margin for read/write operations.

According to an exemplary embodiment of the inventive concept, there is provided a resistive memory device including a first through third word lines, first and second bit lines, and a plurality of memory cells. The first word line extends in a first horizontal direction in a cell array area and a cell wire area surrounding the cell array area on a substrate. The second word line is arranged on the first word line in a vertical direction and extends in the first horizontal direction in the cell array area and the cell wire area. The third word line is arranged on the second word line in the vertical direction and extends in the first horizontal direction in the cell array area and the cell wire area. The first bit line extends between the first and second word lines in a second horizontal direction perpendicular to the first horizontal direction in the cell array area and the cell wire area. The second bit line extends between the second word line and the third word line in the second horizontal direction in the cell array area and the cell wire area. The plurality of memory cells are respectively arranged at intersection points between the word lines and the bit lines in the cell array area. A thickness of the second word line is greater than a thickness of each of the first word line and the third word line in the vertical direction.

According to an exemplary embodiment of the inventive concept, there is provided a resistive memory device including: a plurality of first word lines, a plurality of second word lines, a plurality of third word lines, a plurality of first bit lines, a plurality of second bit lines, and a plurality of memory cells. The plurality of first word lines are arranged in parallel with each other in a cell array area and a cell wire area on a substrate. The first word lines are connected to a first word line driver arranged in a first circuit area on the substrate, and have a first thickness in a vertical direction. The plurality of second word lines are arranged in parallel with each other in the first horizontal direction at locations separated from the plurality of first word lines in a vertical direction. The second word lines are connected to a second word line driver arranged in a second circuit area separated from the first circuit area in the first horizontal direction, and have a second thickness that is greater than the first thickness in the vertical direction. The plurality of third word lines are arranged in parallel with each other in the first horizontal direction at locations separated from the plurality of first word lines in the vertical direction with the plurality of second word lines therebetween. The third word lines are connected to the first word line driver, and have a third thickness that is less than the second thickness in the vertical direction. The plurality of first bit lines are arranged in parallel with each other in a second horizontal direction between the plurality of first word lines and the plurality of second word lines. The plurality of second bit lines are arranged in parallel with each other in the second horizontal direction between the plurality of second word lines and the plurality of third word lines. The plurality of memory cells are arranged at a plurality of intersection points between the word lines and the bit lines in the cell array area.

According to an exemplary embodiment of the inventive concept, there is provided a resistive memory device including a peripheral circuit structure and a cell array structure. The cell array structure includes plurality of first word lines, a plurality of second word lines, and a plurality of third word lines. The peripheral circuit structure includes a plurality of circuit areas that are spaced apart from each other on a substrate. The cell array structure is arranged on the peripheral circuit structure in a vertical direction and includes a cell array area including a plurality of memory cells and a cell wire area surrounding the cell array area. The plurality of first word lines are connected to a plurality of first level memory cells, which are selected from among the plurality of memory cells and arranged at a first level of the substrate in the cell array area, and connected to a first word line driver arranged in a first circuit area through the cell wire area, the first circuit area being selected from among the plurality of circuit areas. The plurality of second word lines are arranged at locations separated from the plurality of first word lines in the vertical direction, connected to a plurality of second level memory cells, which are selected from among the plurality of memory cells and arranged at a second level higher than the first level of the substrate, and a plurality of third level memory cells, which are arranged at a third level higher than the second level, in the cell array area, and connected to a second word line driver arranged in a second circuit area selected from among the plurality of circuit areas through the cell wire area, the second circuit area being separated from the first circuit area in the first horizontal direction. The plurality of third word lines are arranged at locations, which are separated from the plurality of first word lines in the vertical direction with the plurality of second word lines therebetween, connected to a plurality of fourth level memory cells selected from the plurality of memory cells and arranged at a fourth level higher than the third level of the substrate in the cell array area, and connected to the first word line driver through the cell wire area. Thicknesses of the plurality of second word lines are greater than thicknesses of each of the plurality of first word lines and the plurality of third word lines in the vertical direction.

BRIEF DESCRIPTION OF THE DRAWINGS

Embodiments of the inventive concept will be more clearly understood from the following detailed description taken in conjunction with the accompanying drawings in which:

FIG. 16 is a cross-sectional view taken along a line X3-X3' of FIG. 15;

FIGS. 23A to 26C are cross-sectional views for explaining an example manufacturing method of a resistive memory device, according to an exemplary embodiment, FIGS. 23A, 24A, 25A, and 26A are cross-sectional views according to a process order of some areas of each of a cell array area and a first circuit area included in the resistive memory device.

DETAILED DESCRIPTION OF THE EMBODIMENTS

Figure 1:
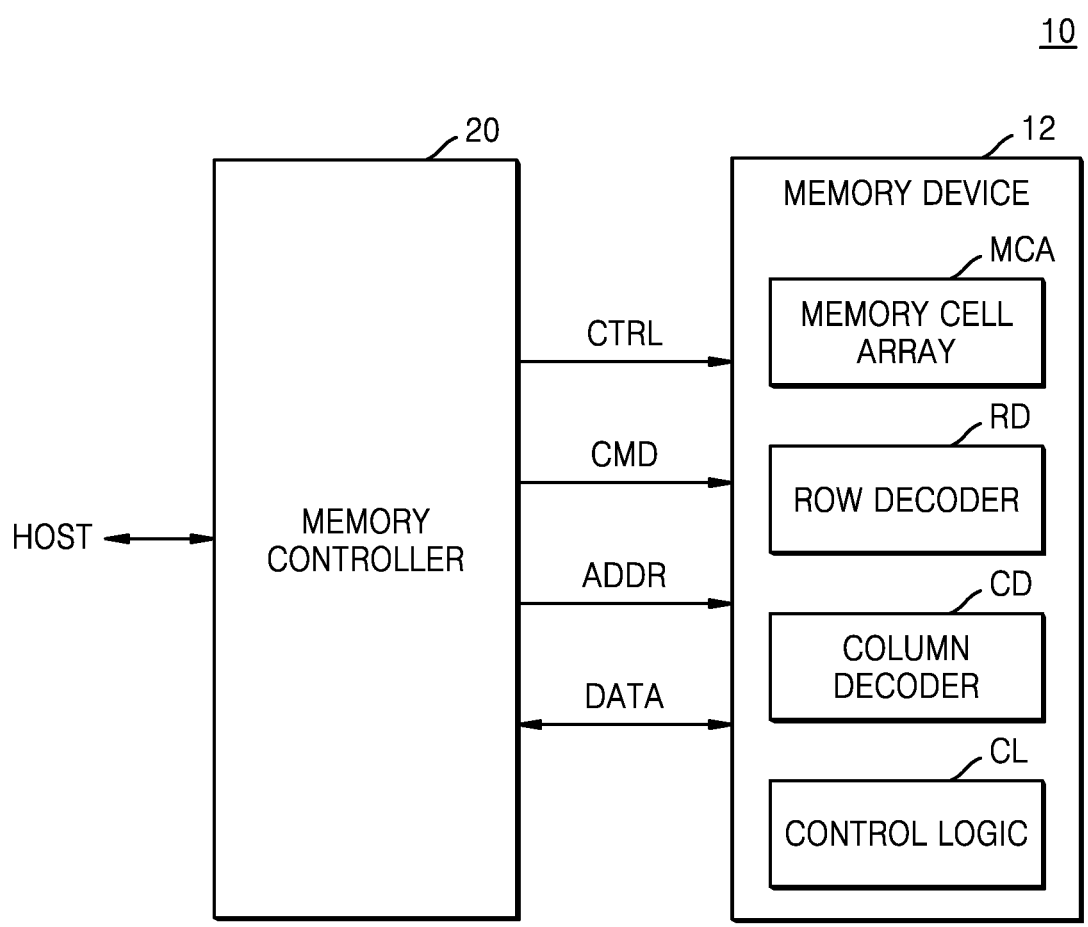
FIG. 1 is a block diagram of a memory system including a resistive memory device, according to an exemplary embodiment of the inventive concept.

Hereinafter, one or more embodiments of the inventive concept will be described in detail with reference to the attached drawings. Like reference symbols in the drawings denote like elements, and repeated descriptions thereof are omitted.

FIG. 1 is a block diagram of a memory system including a resistive memory device, according to embodiments.

Referring to FIG. 1, a memory system 10 includes a memory device 12 and a memory controller 20 (e.g., a control circuit). The memory device 12 includes a memory cell array MCA, a row decoder RD (e.g., a decoder circuit), a column decoder CD (e.g., a decoder circuit), and control logic CL (e.g., a logic circuit).

The memory controller 20 may control the memory device 12 to read data stored in the memory device 12 or write data to the memory device 12, in response to a write/read request from a host. The memory controller 20 may control performance of a program (or write) operation, a read operation, and an erase operation on the memory device 12 by providing an address ADDR, a command CMD, and a control signal CTRL to the memory device 12. Data, which is written, and data that is read may be received/transmitted between the memory controller 20 and the memory device 12.

The memory cell array MCA may include memory cells respectively arranged in areas where first signal lines cross second signal lines. In an example embodiment, the first signal lines are word lines, and the second signal lines are bit lines. In an example embodiment, the first signal lines are bit lines, and the second signal lines are word lines.

Each of the memory cells may include a single level cell (SLC) storing one bit, a multi-level cell (MLC) storing at least two bits of data, or a combination thereof. In an example embodiment, the memory cells include memory cells MC shown in FIGS. 3 and 7 to 9.

In an embodiment, the memory cell array MCA includes a variable resistive device. For example, the memory cell area MCA may include resistive memory cells, each resistive memory cell includes a variable resistor R of FIG. 3. When the variable resistive device includes a phase change material of which a phase is changed according to a temperature, the memory device 12 may be a Phase Change Random Access Memory (PRAM) device.

The row decoder RD may drive word lines of the memory cell array MCA, and the column decoder CD may drive bit lines of the memory cell array MCA. The row decoder RD may include a decoding mechanism for decoding a row address and a switching mechanism for controlling switching in response to various row control signals according to a decoding result.

The column decoder CD may include a decoding mechanism for decoding a column address and a switching mechanism for controlling switching in response to various column control signals according to a decoding result.

The control logic CL may control all operations of the memory device 12 and may control the row decoder RD and the column decoder CD to perform an operation of selecting a memory cell in the memory cell array MCA. For example, the control logic CL may generate a row address and a column address by processing addresses received from an outside source. The memory device 12 may include a power generator (not shown) for generating various write and read voltages used for write and read operations, and the read and write voltages may be provided to the memory cells through the row decoder RD and the column decoder CD under the control of the control logic CL.

Figure 2:
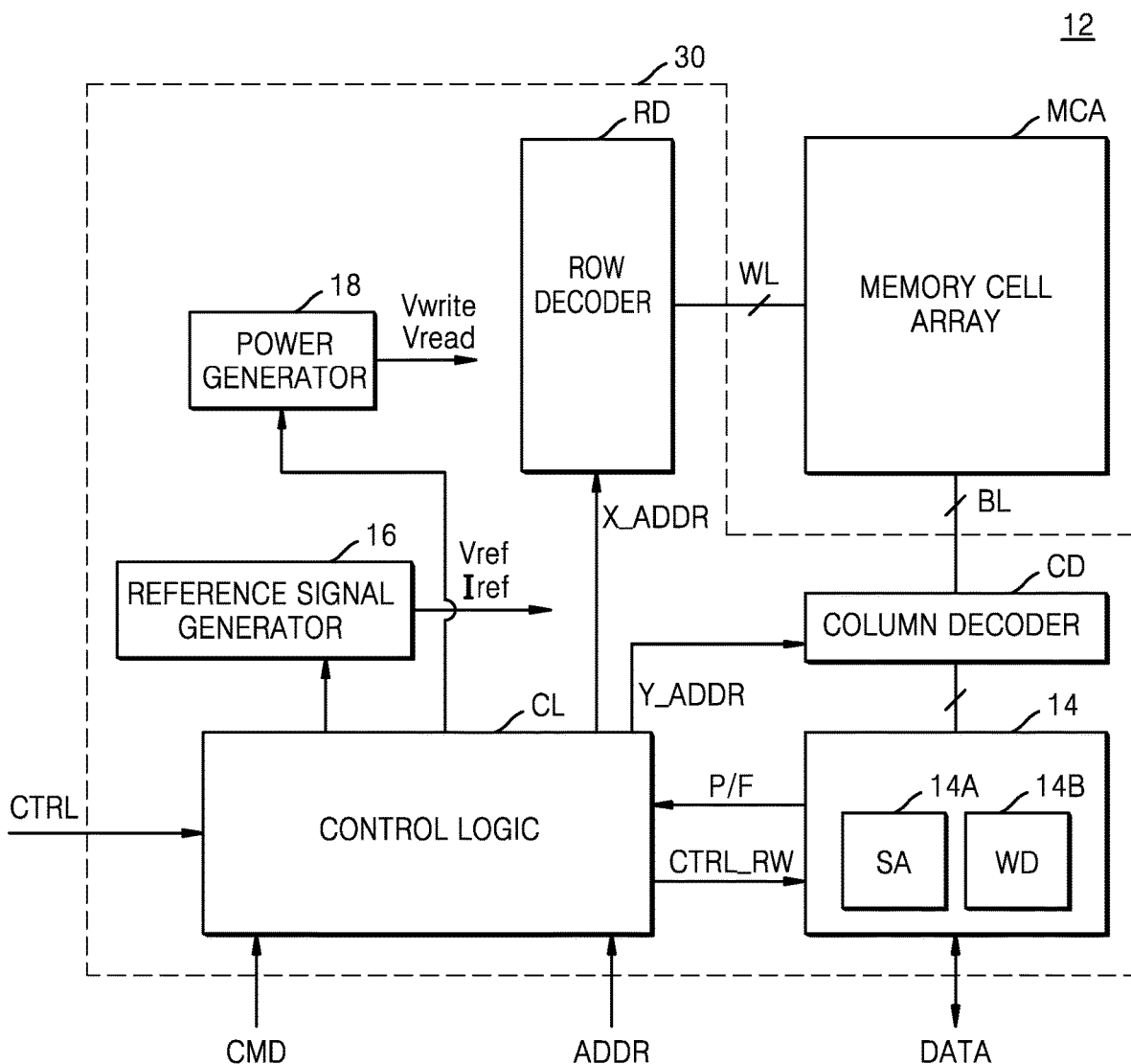
FIG. 2 is a block diagram for explaining an example structure of the memory device of FIG. 1.

FIG. 2 is a block diagram for explaining an example structure of the memory device 12 of FIG. 1.

Referring to FIG. 2, the memory device 12 includes the memory cell array MCA and a peripheral circuit 30. The peripheral circuit 30 includes the row decoder RD, the column decoder CD, and the control logic CL. Also, the peripheral circuit 30 may further include a read/write circuit 14, a reference signal generator 16, and a power generator 18. In an embodiment, the read/write circuit 14 includes a sense amplifier 14A and a write driver 14B.

The memory cell array MCA includes memory cells connected to the word lines WL and the bit lines BL. Various voltage signals or current signals may be provided to the memory cell array MCA through the word lines WL and the bit lines BL. Accordingly, data may be written to or read from memory cells selected from the memory cell array MCA, and a write operation or a read operation is not performed on non-selected memory cells.

In the control logic CL, the address ADDR included in the command CMD and used to indicate a memory cell to be accessed may be received. The address ADDR may include a row address X_ADDR for selecting the word line WL of the memory cell array MCA and a column address Y_ADDR for selecting the bit line BL of the memory cell array MCA. The row decoder RD may perform a word line selection operation in response to the row address X_ADDR and a bit line selection operation in response to the column address Y_ADDR.

The write/read circuit 14 may be connected to the bit line BL to write the data to the memory cell or read the data therefrom.

The power generator 18 may generate a write voltage Vwrite used for the write operation and a read voltage Vread used for the read operation. The write voltage Vwrite may include a set voltage and a reset voltage. The write voltage Vwrite and the read voltage Vread may be provided to the bit line BL through the column decoder CD or to the word line WL through the row decoder RD.

The reference signal generator 16 may generate a reference voltage Vref and a reference current Tref as various reference signals related to a data read operation.

In the write/read circuit 14, the sense amplifier 14A may be connected to a sensing node of the bit line BL to determine the data by using the reference voltage Vref or the reference current Tref. The write/read circuit 14 may provide a pass/fail signal P/F to the control logic CL, according to a result of determining the read data. The control logic CL may control the write and read operations of the memory cell array MCA, according to the pass/fail signal P/F.

The control logic CL may output various control signals CTRL_RW for writing data to the memory cell array MCA or reading the data from the memory cell array MCA, according to the address ADDR, the command CMD, and the control signal CTRL received from the memory controller 20 (see FIG. 1).

The peripheral circuit 30 may further include various circuits such as a voltage generation circuit for generating various voltages required to drive the memory device 12, an error correction circuit for correcting errors in the data read from the memory cell array MCA, and an input/output interface.

Figure 3:
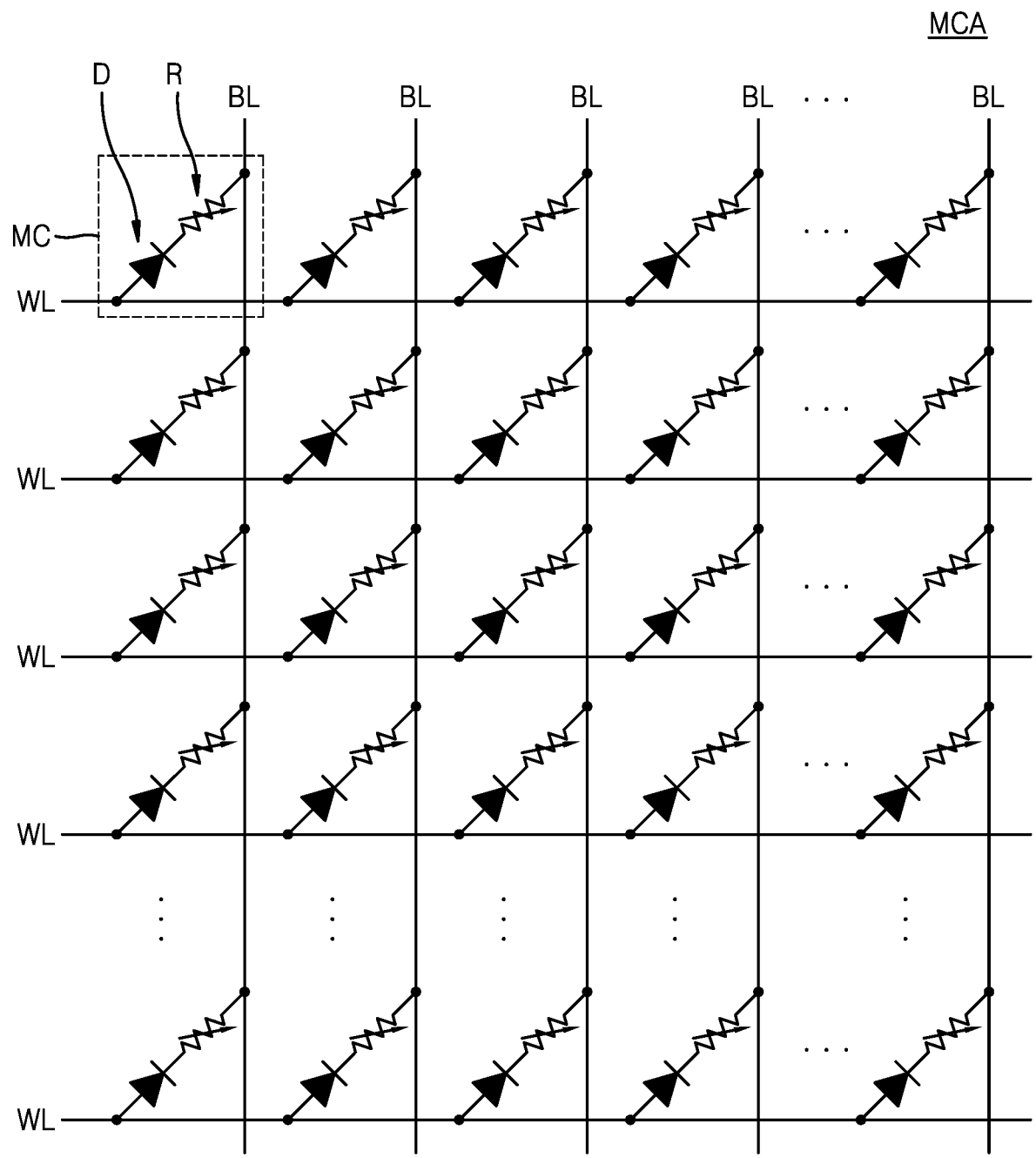
FIG. 3 is a circuit diagram of an embodiment of a memory cell array of FIG. 2.

FIG. 3 is a circuit diagram of an embodiment of the memory cell array MCA of FIG. 2.

Referring to FIG. 3, the memory cell array MCA includes memory cells MC arranged at different levels in a vertical direction. The term "level" used in the present specification indicates a height in a vertical direction (a Z direction or a −Z direction). FIG. 3 illustrates a circuit diagram of memory cells MC arranged at any one level selected from among the levels.

The memory cell array MCA may include the word lines WL, the bit lines BL, and the memory cells MC. Each memory cell MC may be arranged at an intersection point where the word line and the bit line BL cross each other. The number of word lines WL, the number of bit lines BL, and the number of memory cells MC, which are arranged at respective levels of the memory cell array MCA, may vary as needed.

The memory cells MC may each include a variable resistor R for storing information and a selection device D for selecting a memory cell. The selection device D may be electrically connected to one of the word lines WL, the variable resistor R may be electrically connected to one of the bit lines BL, and the variable resistor R and the selection device D may be connected in series. However, embodiments of the inventive concept are not limited thereto. For example, the variable resistor R may be connected to the word line WL, and the selection device D may be connected to the bit line BL.

To drive the memory device 12 (see FIG. 2), a voltage may be applied to the variable resistor R of the memory cell MC through the word lines WL and the bit lines BL, and thus, a current may flow in the variable resistor R. A state of the variable resistor R may be changed to one of a plurality of resistance states according to an applied electrical pulse. In an example embodiment, the variable resistor R includes a phase change material of which a crystal state is changed according to the current amount. The state of the phase change material may be changed to an amorphous state having a relatively high resistance or a crystal state having a relatively low resistance. A phase of the phase change material may be changed by Joule's heat generated according to the current amount, and the data may be written by using the phase change. For example, a memory cell MC may represent data of different states according to the phase of its phase change material or the resistance of the phase change material.

An arbitrary memory cell MC may be addressed according to selections of the word lines WL and the bit lines BL, and a certain signal may be transmitted between the selected word line WL and bit line BL to program the memory cell MC. Also, by measuring a current value through the bit lines BL, information according to a resistance value of a resistive memory pattern of the corresponding memory cell MC, that is, programmed information, may be read. For example, the measured current value may be used to calculate the resistance value, and the calculated resistance value may be used to determine the programmed information.

Figure 4:
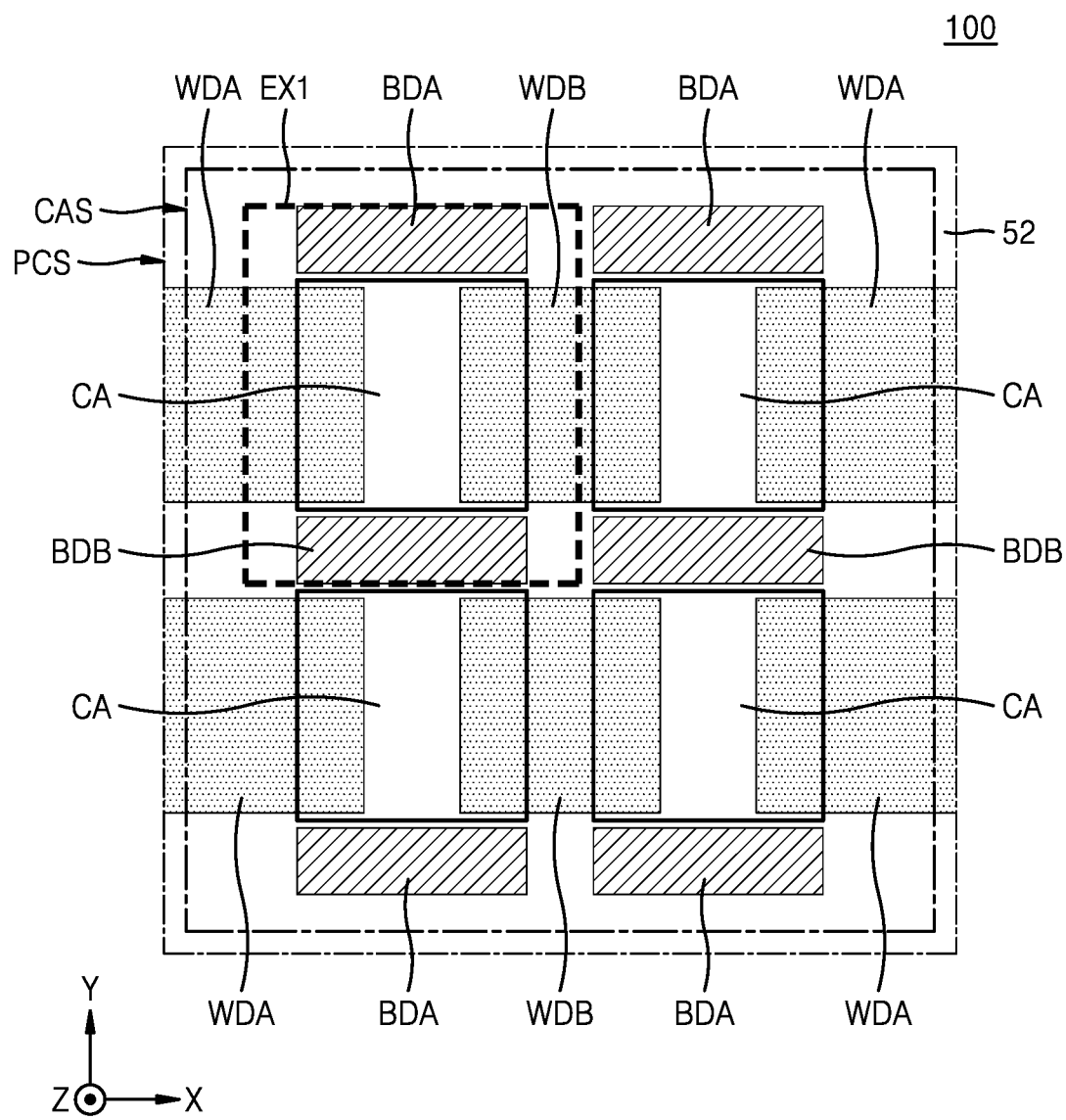
FIG. 4 is a schematic plan layout of a resistive memory device according to an exemplary embodiment of the inventive concept.

FIG. 4 is a schematic plan layout of the resistive memory device 100 according to an exemplary embodiment of the inventive concept.

Referring to FIG. 4, the resistive memory device 100 may be used to implement the memory device 12 of FIG. 1. The resistive memory device 100 includes a cell array structure CAS and a peripheral circuit structure PCS that are at different levels in the vertical direction (the Z direction) and overlap each other in the vertical direction (the X direction). The cell array structure CAS may be arranged on peripheral circuit structure PCS in the vertical direction (the X direction). The cell array structure CAS may include the memory cell array MCA described with reference to FIG. 2. The peripheral circuit structure PCS may include the peripheral circuit 30 described with reference to FIG. 1.

Figure 5:
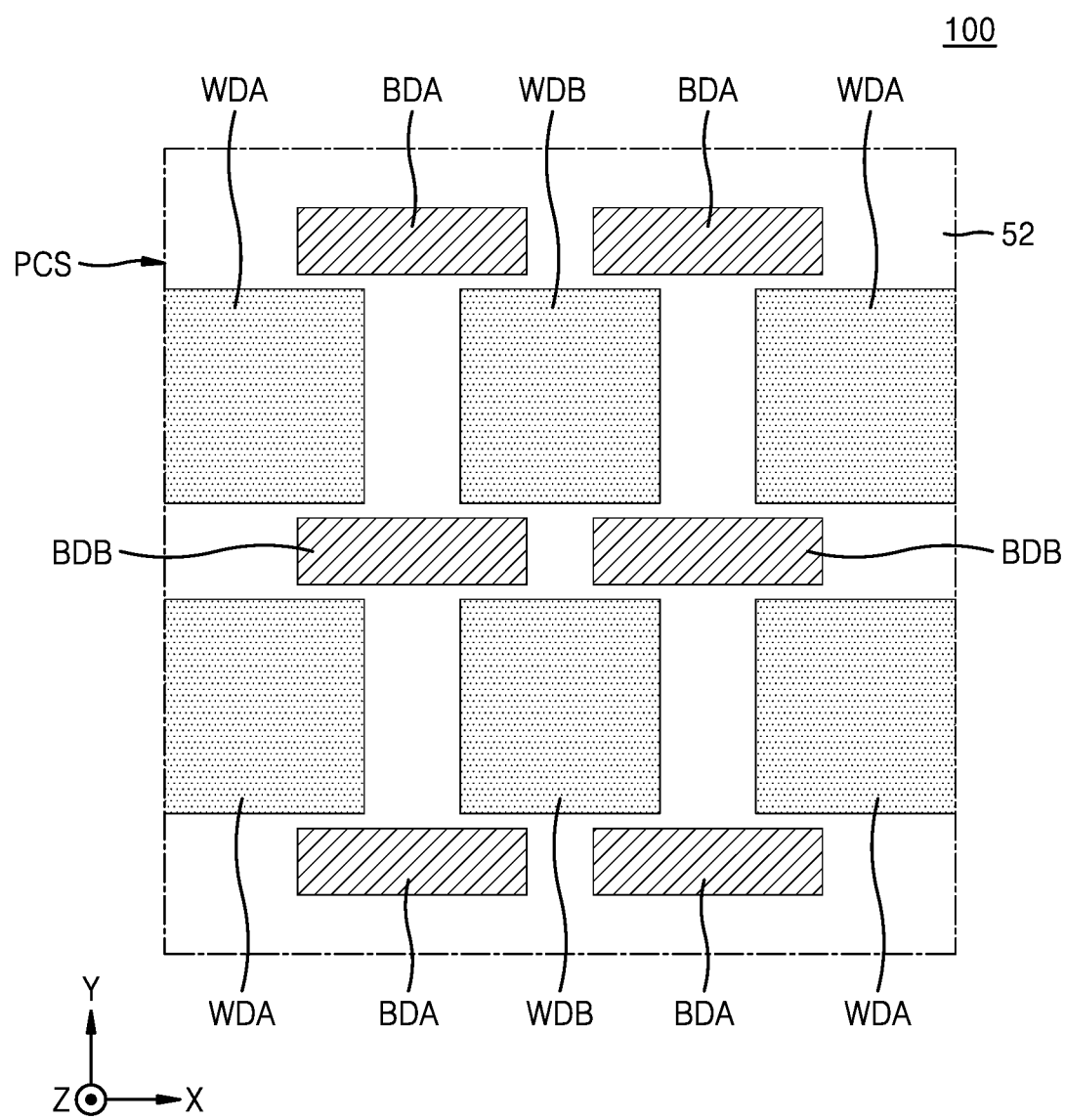
FIG. 5 is a plan layout of a peripheral circuit structure included in the resistive memory device of FIG. 4.
Figure 6:
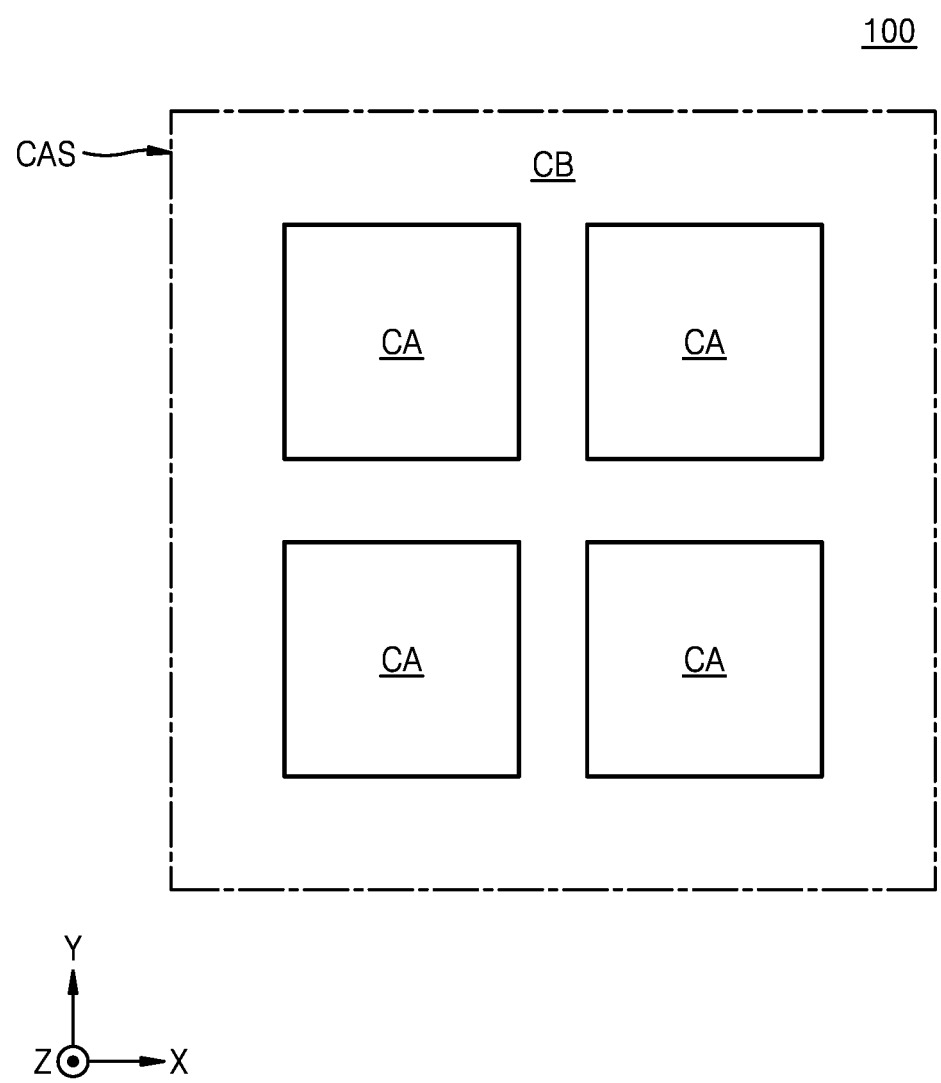
FIG. 6 is a plan layout of a cell array structure included in the resistive memory device of FIG. 4.
Figure 7:
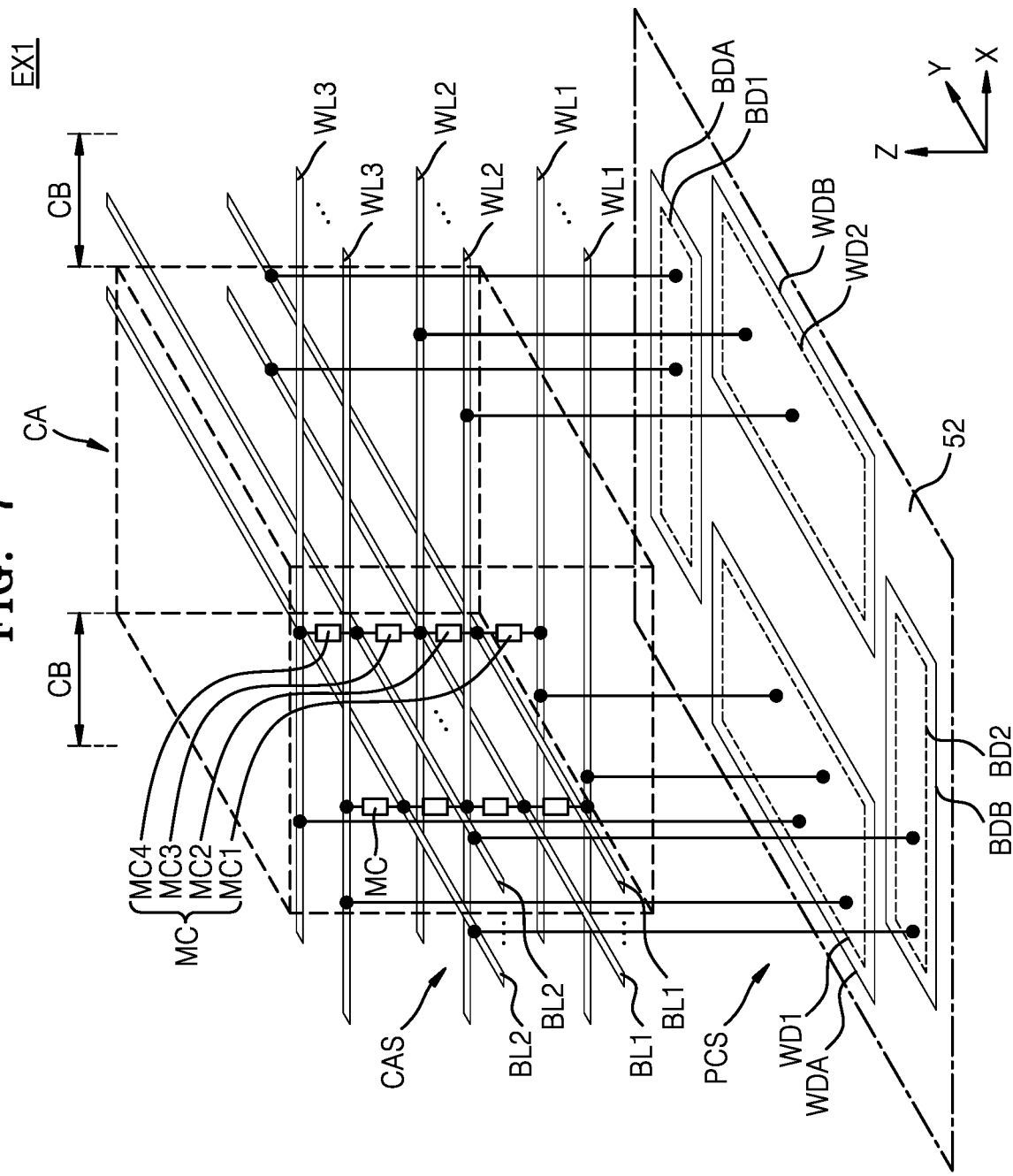
FIG. 7 is a schematic perspective view of main components in a local region indicated as "EX1"

FIG. 5 is a plan layout of a peripheral circuit structure PCS of the resistive memory device 100 of FIG. 4, FIG. 6 is a plan layout of the cell array structure CAS of the resistive memory device 100 of FIG. 4, and FIG. 7 is a schematic perspective view of main components in a local region "EX1."

Referring to FIGS. 4 and 7, the peripheral circuit structure PCS includes first to fourth circuit areas WDA, WDB, BDA, and BDB arranged at separate locations on a substrate 52.

The cell array structure CAS may be arranged on the peripheral circuit structure PCS in the vertical direction (the Z direction). The cell array structure CAS includes cell array areas CA including the memory cells MC, and cell wire areas CB respectively surrounding the cell array areas CA.

The memory cells MC include first level memory cells MC1 arranged at a first level on the substrate 52, second level memory cells MC2 arranged at a second level higher than the first level on the substrate 52, third level memory cells MC3 arranged at a third level higher than the second level on the substrate 52, and fourth level memory cells MC4 arranged at a fourth level higher than the third level on the substrate 52.

The cell array structure CAS includes first word lines WL1, first bit lines BL1, second word lines WL2, second bit lines BL2, and third word lines WL3 sequentially stacked in the vertical direction (the Z direction) in the cell array area CA.

The first word lines WL1 may extend and be arranged parallel to each other in a first horizontal direction (an X direction) in the cell array area CA and the cell wire area CB. The second word lines WL2 may extend and be arranged parallel to each other in the first horizontal direction (the X direction) at locations separated from the first word lines WL1 in the first vertical direction (the Z direction). The third word lines WL3 may extend and be arranged parallel to each other in the first horizontal direction (the X direction) at locations separated from the first word lines WL1 in the first vertical direction (the Z direction) with the second word lines WL2 therebetween.

The first bit lines BL1 may extend and be arranged parallel to each other between the first word lines WL1 and the second word lines WL2 in a second horizontal direction (a Y direction). The second bit line BL2 may extend and be arranged parallel to each other between the second word lines WL2 and the third word lines WL3 in the second horizontal direction (the Y direction).

In the cell array area CA, the memory cells MC may be arranged, respectively, at first intersection points between the first word lines WL1 and the first bit lines BL1, second intersection points between the first bit lines BL1 and the second word lines WL2, third intersection points between the second word lines WL2 and the second bit lines BL2, and fourth intersection points between the second bit lines BL2 and the third word lines WL3.

The first word lines WL1 may be respectively connected to the first level memory cells MC1 from among the memory cells MC. The second word lines WL2 may be respectively connected to the second level memory cells MC2 and the third level memory cells MC3 from among the memory cells MC. The third word lines WL3 may be respectively connected to the fourth level memory cells MC4 from among the memory cells MC.

The first bit lines BL1 may be respectively connected to the first level memory cells MC1 and the second level memory cells MC2 from among the memory cells MC. The second bit lines BL2 may be respectively connected to the third level memory cells MC3 and the fourth level memory cells MC4 from among the memory cells MC.

The first level memory cells MC1, the second level memory cells MC2, the third level memory cells MC3, and the fourth level memory cells MC4 may respectively have equivalent circuit configurations, as described with regard to the memory cells MC by referring to FIG. 3.

In the peripheral circuit structure PCS, the first to fourth circuit areas WDA, WDB, BDA, and BDB may be respectively arranged between the substrate 52 and the first word lines WL1. The first to fourth circuit areas WDA, WDB, BDA, and BDB include a first circuit area WDA including a first word line driver WD1 (e.g., a driver circuit), a second circuit area WDB (e.g., a driver circuit) including a second word line driver WD2 (e.g., a driver circuit), a third circuit area BDA including a first bit line driver BD1 (e.g., a driver circuit), and a fourth circuit area BDB including a second bit line driver BD2 (e.g., a driver circuit). In an embodiment, the first circuit area WDA and the second circuit area WDB are spaced apart from each other in the first horizontal direction (the X direction) with the cell array area CA therebetween. Portions of each of the first circuit area WDA and the second circuit area WDB may overlap the cell array area CA in the vertical direction (the Z direction), and other portions of each of the first circuit area WDA and the second circuit area WDB may overlap the cell wire area CB in the vertical direction (the Z direction). The first circuit area WDA and the second circuit area WDB may be on opposing sides of the substrate 52. In an embodiment, the third circuit area BDA and the fourth circuit area BDB are spaced apart from each other in the second horizontal direction (the Y direction) with the cell array area CA therebetween. Each of the third circuit area BDA and the fourth circuit area BDB may overlap the cell wire area CB in the vertical direction (the Z direction) and may not overlap the cell array area CA in the vertical direction (the Z direction). The third circuit area BDA and the fourth circuit area BDB may be on opposing sides of substrate 52.

In the cell array structure CAS, the first word lines WL1 and the third word lines WL3 may each be electrically connected to the first word line driver WD1 arranged in the first circuit area WDA. The second word lines WL2 may each be electrically connected to the second word line driver WD2 arranged in the second circuit area WDB. The first bit lines BL1 may each be electrically connected to the first bit line driver BD1 arranged in the third circuit area BDA. The second bit lines BL2 may each be electrically connected to the second bit line driver BD2 arranged in the fourth circuit area BDB.

Figure 8:
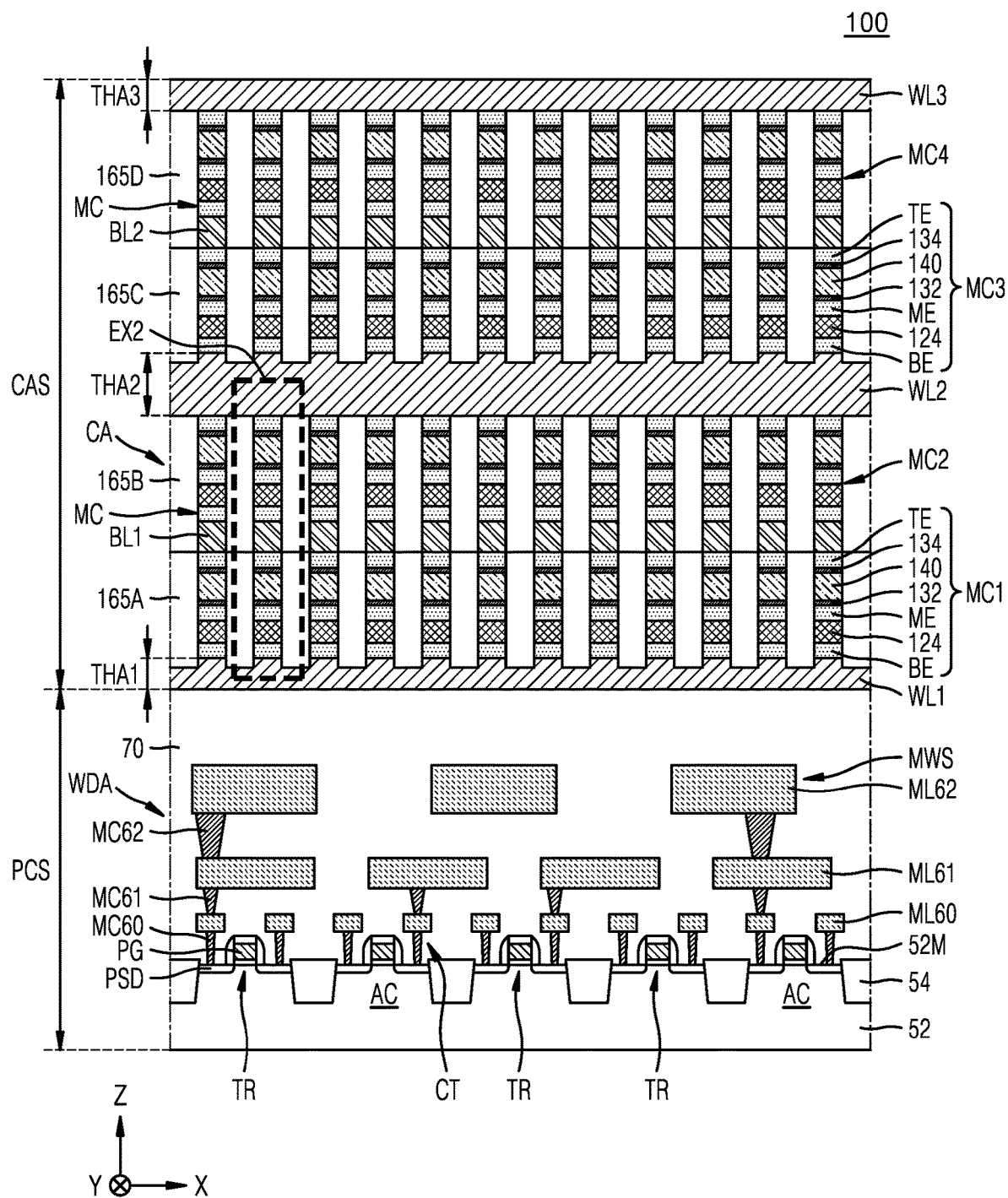
FIG. 8 is a schematic cross-sectional view of some portions of each of a cell array area and a first circuit area included in a resistive memory device, according to an exemplary embodiment of the inventive concept.
Figure 9:
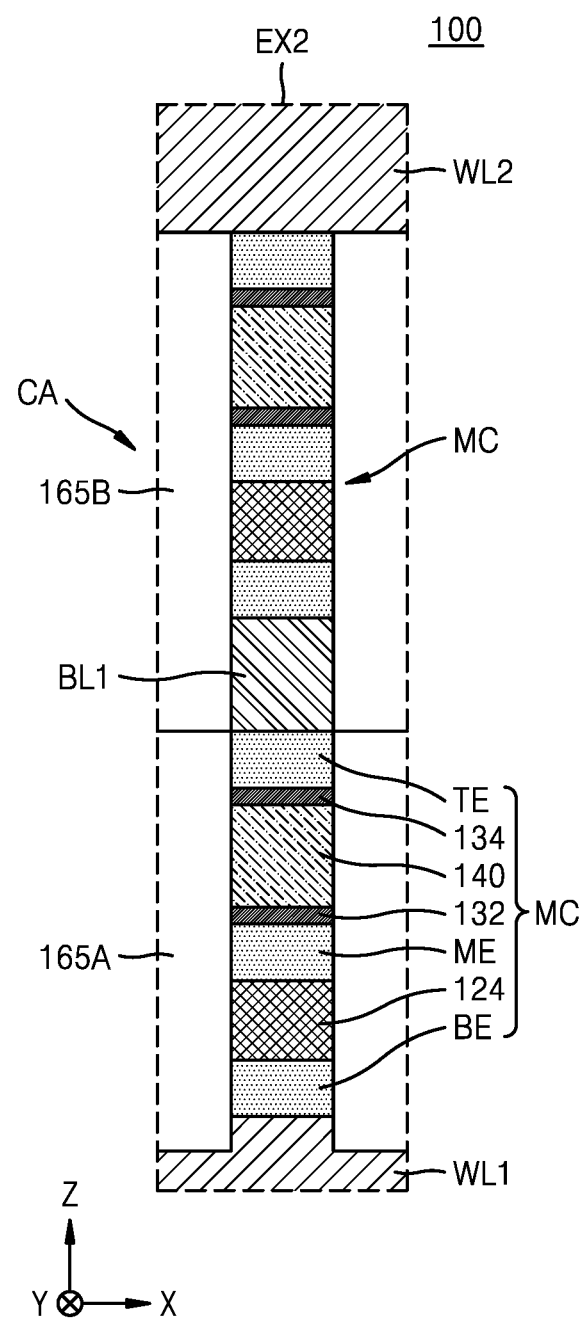
FIG. 9 is an enlarged cross-sectional view of main components in a local region indicated as "EX2"

FIG. 8 is a schematic cross-sectional view of some portions of each of the cell array structure CAS of the resistive memory device 100 of FIGS. 4 and 7 and the first circuit area WDA on a lower portion of the cell array area CA of the peripheral circuit structure PCS. FIG. 9 is an enlarged cross-sectional view of main components in a local region "EX2."

Referring to FIGS. 8 and 9, the resistive memory device 100 includes the peripheral circuit structure PCS and the cell array structure CAS arranged on the peripheral circuit structure PCS and overlapping the same in the vertical direction (the Z direction).

The peripheral circuit structure PCS includes the substrate 52, circuits CT formed on a main surface 52M of the substrate 52, and a multilayer wire structure MWS. The first word lines WL1, the first bit lines BL1, the second word lines WL2, the second bit lines BL2, and the third word lines WL3 included in the cell array structure CAS may each be connected to at least one circuit CT selected from among the circuits CT, through the multilayer wire structure MWS included in the peripheral circuit structure PCS. The circuits CT may include various circuits included in the peripheral circuit 30 described with reference to FIG. 1. The peripheral circuit structure PCS may include the first to fourth circuit areas WDA, WDB, BDA, and BDB described with reference to FIGS. 4, 5, and 7, and the circuits CT may include the first word line driver WD1, the second word line driver WD2, the first bit line driver BD1, and the second bit line driver BD2 described with reference to FIG. 7. In an example embodiment, the circuits CT may further include unit elements such as a resistor and a capacitor.

The substrate 52 may include a semiconductor substrate. For example, the substrate 52 may include Silicon (Si), Germanium (Ge), or Silicon-germanium (SiGe). In the substrate 52, an active area AC may be defined by a device isolation layer 54. In the active area AC, transistors TR forming the circuits CT may be formed. The transistors TR may each include a gate PG and source/drain areas PSD formed on both sides of the gate PG in the active area AC.

The multilayer wire structure MWS may include peripheral circuit wire layers ML60, ML61, and ML62 connected to the circuits CT and peripheral circuit contacts MC60, MC61, and MC62. At least some portions of the peripheral circuit wire layers ML60, ML61, and ML62 may be electrically connected to the transistors TR. The peripheral circuit contacts MC60, MC61, and MC62 may interconnect selected ones of the transistors TR and the peripheral circuit wire layers ML60, ML61, and ML62. For example, FIG. 8 shows a peripheral circuit contact MC60 being connected to a gate PG of a transistor TR.

The peripheral circuit wire layers ML60, ML61, and ML62 and the peripheral circuit contacts MC60, MC61, and MC62 may each include metal, conductive metal nitride, metal silicide, or a combination thereof. For example, the peripheral circuit wire layers ML60, ML61, and ML62 and the peripheral circuit contacts MC60, MC61, and MC62 may each include a conductive material such as tungsten, molybdenum, titanium, cobalt, tantalum, nickel, tungsten silicide, titanium silicide, cobalt silicide, tantalum silicide, or nickel silicide.

FIG. 8 illustrates that the multilayer wire structure MWS includes a tri-layer wire layer in the vertical direction (the Z direction), embodiments of the inventive concept are not limited to the illustration of FIG. 8. For example, the multilayer wire structure MWS may have a wire layer having two or at least four layers.

The circuits CT, the peripheral circuit wire layers ML60, ML61, and ML62 and the peripheral circuit contacts MC60, MC61, and MC62 may be covered by an interlayer insulating layer 70. The interlayer insulating layer 70 may include silicon oxide, silicon oxynitride (SiON), silicon oxycarbonitride (SiOCN) or the like.

In the cell array area CA of the cell array structure CAS, the first word lines WL1, the first bit lines BL1, the second word lines WL2, the second bit lines BL2, and the third word lines WL3 may be sequentially stacked, in the vertical direction (the X direction), on the interlayer insulating layer 70 of the peripheral circuit structure PCS.

In the cell array area CA, the first word lines WL1, the first bit lines BL1, the second word lines WL2, the second bit lines BL2, and the third word lines WL3 may each include metal, conductive metal nitride, conductive metal oxide, or a combination thereof. In example embodiments, the first word lines WL1, the first bit lines BL1, the second word lines WL2, the second bit lines BL2, and the third word lines WL3 may each include W, Ti, Ta, Al, Cu, C, CN, TiN, TiAlN, TiSiN, TiCN, TiCSiN, WN, CoSiN, WSiN, TaN, TaCN, TaSiN, Au, Ag, Jr, Pt, Pd, Ru, Zr, Rh, Ni, Co, Cr, Sn, Zn, indium tin oxide (ITO), an alloy thereof, or a combination thereof. Each of the first word lines WL1, the first bit lines BL1, the second word lines WL2, the second bit lines BL2, and the third word lines WL3 may further include a conductive barrier layer. The conductive barrier layer may include, for example, Ti, TiN, Ta, TaN, or a combination thereof.

In example embodiments, materials of metal layers forming the second word lines WL2 from among the first word lines WL1, the second word lines WL2, and the third word lines WL3 are different from materials of metal layers forming the first word lines WL1 and the third word lines WL3. For example, the first word lines WL1 and the third word lines WL3 may include first metal layers having a first resistivity, and the second word lines WL2 may include second metal layers having a second resistivity that is lower than the first resistivity.

For example, the first word lines WL1, the second word lines WL2, and the third word lines WL3 each include a tungsten (W) layer having the same resistivity.

As another example, the first word lines WL1 and the third word lines WL3 each include a W layer, and the second word lines WL2 may each include a copper (Cu) layer.

As another example, the first word lines WL1, the second word lines WL2, and the third word lines WL3 each include a W layer, but the first word lines WL1 and the third word lines WL3 each include a W layer having the first resistivity, whereas the second word lines WL2 each include a W layer having the second resistivity that is lower than the first resistivity. In an embodiment, a grain size of the W layer having the second resistivity is greater than a grain size of the W layer having the first resistivity. To realize such a configuration, during a deposition process in which W layers forming the first word lines WL1, the second word lines WL2, and the third word lines WL3 are respectively formed, deposition process conditions of the W layers may be controlled to obtain a desired grain size of the W layer.

In the cell array area CA, at least some of the first word lines WL1, the second word lines WL2, and the third word lines WL3 may have different thicknesses. In an exemplary embodiment of the inventive concept, in the vertical direction (the Z direction), a maximum thickness THA2 of the second word lines WL2 is greater than a maximum thickness THA1 of the first word lines WL1 and a maximum thickness THA3 of the third word lines WL3. The maximum thickness THA1 of the first word lines WL1 and the maximum thickness THA3 of the third word lines WL3 may be identical to or different from each other.

In an example embodiment of the inventive concept, the maximum thickness THA2 of the second word lines WL2 in the vertical direction (the Z direction) is about 1.1 to 2 times the maximum thickness THA1 of the first word lines WL1, but embodiments of the inventive concept are not limited thereto. In an exemplary embodiment, the current thickness of the second word lines WL2 is greater than the current thickness of first word lines WL1 and the current thickness of the third word line WL3. For example, the current thickness of the second word lines WL2 may be about 1.1 to about 2 times the current thickness of the first word lines WL1 and/or the current thickness of the third word line WL3.

The memory cells MC in the cell array area CA may include: the first level memory cells MC1 respectively arranged at the first intersection points between the first word lines WL1 and the first bit lines BL1; the second level memory cells MC2 respectively arranged at the second intersection points between the first bit lines BL1 and the second word lines WL2; the third level memory cells MC3 respectively arranged at the third intersection points between the second word lines WL2 and the second bit lines BL2; and the fourth level memory cells MC4 respectively arranged at the fourth intersection points between the second bit lines BL2 and the third word lines WL3.

In an example embodiment of the inventive concept, in the cell array area CA, an upper surface of each of the first word lines WL1 and the second word lines WL2 extend in a form of uneven portions in the first horizontal direction (the X direction). Thicknesses of portions of the first word lines WL1 and the second word lines WL2 respectively between the memory cells MC may be less than thicknesses of portions covered by the memory cells MC. In an example embodiment, the upper surface of each of the first word lines WL1 and the second word lines WL2 extend flat in the first horizontal direction (the X direction), and the thicknesses of the portions of the first word lines WL1 and the second word lines WL2 respectively between the memory cells MC are substantially the same as the thicknesses of the portions covered by the memory cells MC.

In an embodiment, the first to fourth level memory cells MC1, MC2, MC3, and MC4 included in the memory cells MC each include a lower electrode BE, a selection device 124, an intermediate electrode ME, a lower barrier 132, a resistive memory pattern 140, an upper barrier 134, and an upper electrode TE that are sequentially stacked in the vertical direction (the Z direction).

In the memory cells MC, each of the lower electrode BE, the intermediate electrode ME, and the upper electrode TE may include, for example, a conductive material such as W, Ti, Ta, Al, Cu, C, CN, TiN, TiAlN, TiSiN, TiCN, TiCSiN, WN, CoSiN, WSiN, TaN, TaCN, TaSiN, or a combination thereof, but embodiments of the inventive concept are not limited thereto.

In the memory cells MC, the selection device 124 may include a chalcogenide switching material configured to be set into one of an amorphous state and a crystalline state. The selection device 124 may include a material layer of which a resistance is changed according to a size of a voltage applied to both ends of the selection device 124. For example, the selection device 124 may include an Ovonic Threshold Switching (OTS) material. The OTS material may include a chalcogenide switching material. In example embodiments, the selection device 124 may be a layer or a multilayer including a material selected from the group consisting of two-component materials such as GeSe, GeS, AsSe, AsTe, AsS, SiTe, SiSe, SiS, GeAs, SiAs, SnSe, and SnTe, three-component materials such as GeAsTe, GeAsSe, AlAsTe, AlAsSe, SiAsSe, SiAsTe, GeSeTe, GeSeSb, GaAsSe, GaAsTe, InAsSe, InAsTe, SnAsSe, and SnAsTe, four-component materials such as GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, and GeAsTeZn, five-component materials such as GeSiAsSeTe, GeAsSeTeS, GeSiAsSeS, GeSiAsTeS, GeSiSeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeSTl, GeAsSeSZn, GeAsSeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeInSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, and GeAsSeZnSn, and six-component materials such as GeSiAsSeTeS, GeSiAsSeTeIn, GeSiAsSeTeGa, GeSiAsSeTeAl, GeSiAsSeTeTl, GeSiAsSeTeZn, GeSiAsSeTeSn, GeSiAsSeTeP, GeSiAsSeIn, GeSiAsSeGa, GeSiAsSeAl, GeSiAsSeSTl, GeSiAsSeSZn, GeSiAsSeSSn, GeAsSeTeSIn, GeAsSeTeSGa, GeAsSeTeSAl, GeAsSeTeSTl, GeAsSeTeSZn, GeAsSeTeSSn, GeAsSeTePIn, GeAsSeTePGa, GeAsSeTePAl, GeAsSeTePTl, GeAsSeTePZn, GeAsSeTePSn, GeSiAsSeInGa, GeSiAsSeInAl, GeSiAsSeInTl, GeSiAsSeInZn, GeSiAsSeInSn, GeSiAsSeGaAl, GeSiAsSeGaTl, GeSiAsSeGaZn, GeSiAsSeGaSn, GeSiAsSeAlSn, GeAsSeTeInGa, GeAsSeTeInAl, GeAsSeTeInTl, GeAsSeTeInZn, GeAsSeTeInSn, GeAsSeTeGaAl, GeAsSeTeGaTl, GeAsSeTeGaZn, GeAsSeTeGaSn, GeAsSeTeAlSn, GeAsSeSInGa, GeAsSeSInAl, GeAsSeSInTl, GeAsSeSInZn, GeAsSeSInSn, GeAsSeSGaAl, GeAsSeSGaTl, GeAsSeSGaZn, GeAsSeSGaSn, and GeAsSeSAlSn.

In other example embodiments, the selection device 124 may include at least one material selected from the above two-component to six-component materials and at least one additional element selected from the group consisting of B, C, N, and O.

The resistive memory pattern 140 may include a phase change material that reversibly changes between the amorphous state and the crystalline state, according to a heating time. For example, the phase of the resistive memory pattern 140 may be reversibly changed according to Joule's heat generated by voltages applied to both ends of the resistive memory pattern 140 and may include a material that has a resistance changed according to such a phase change. In example embodiments, the resistive memory pattern 140 may include a chalcogenide material as the phase change material. In example embodiments, the resistive memory pattern 140 may be a layer or a multilayer including a material selected from the group consisting of two-component materials such as GeTe, GeSe, GeS, SbSe, SbTe, SbS, SbSe, SnSb, InSe, InSb, AsTe, AlTe, GaSb, AlSb, BiSb, ScSb, Ysb, CeSb, DySb, and NdSb, three-component materials such as GeSbSe, AlSbTe, AlSbSe, SiSbSe, SiSbTe, GeSeTe, InGeTe, GeSbTe, GeAsTe, SnSeTe, GeGaSe, BiSbSe, GaSeTe, InGeSb, GaSbSe, GaSbTe, InSbSe, InSbTe, SnSbSe, SnSbTe, ScSbTe, ScSbSe, ScSbS, YSbTe, YSbSe, YSbS, CeSbTe, CeSbSe, CeSbS, DySbTe, DySbSe, DySbS, NdSbTe, NdSbSe, and NdSbS, four-component materials such as GeSbTeS, BiSbTeSe, AgInSbTe, GeSbSeTe, GeSnSbTe, SiGeSbTe, SiGeSbSe, SiGeSeTe, BiGeSeTe, BiSiGeSe, BiSiGeTe, GeSbTeBi, GeSbSeBi, GeSbSeIn, GeSbSeGa, GeSbSeAl, GeSbSeTl, GeSbSeSn, GeSbSeZn, GeSbTeIn, GeSbTeGa, GeSbTeAl, GeSbTeTl, GeSbTeSn, GeSbTeZn, ScGeSbTe, ScGeSbSe, ScGeSbS, YGeSbTe, YGeSbSe, YGeSbS, CeGeSbTe, CeGeSbSe, CeGeSbS, DyGeSbTe, DyGeSbSe, DyGeSbS, NdGeSbTe, NdGeSbSe, and NdGeSbS, and five-component materials such as InSbTeAsSe, GeScSbSeTe, GeSbSeTeS, GeScSbSeS, GeScSbTeS, GeScSeTeS, GeScSbSeP, GeScSbTeP, GeSbSeTeP, GeScSbSeIn, GeScSbSeGa, GeScSbSeAl, GeScSbSeTl, GeScSbSeZn, GeScSbSeSn, GeScSbTeIn, GeScSbTeGa, GeSbAsTeAl, GeScSbTeTl, GeScSbTeZn, GeScSbTeSn, GeSbSeTeIn, GeSbSeTeGa, GeSbSeTeAl, GeSbSeTeTl, GeSbSeTeZn, GeSbSeTeSn, GeSbSeSIn, GeSbSeSGa, GeSbSeSAl, GeSbSeSTl, GeSbSeSZn, GeSbSeSSn, GeSbTeSIn, GeSbTeSGa, GeSbTeSAl, GeSbTeSTl, GeSbTeSZn, GeSbTeSSn, GeSbSeInGa, GeSbSeInAl, GeSbSeInTl, GeSbSeInZn, GeSbSeInSn, GeSbSeGaAl, GeSbSeGaTl, GeSbSeGaZn, GeSbSeGaSn, GeSbSeAlTl, GeSbSeAlZn, GeSbSeAlSn, GeSbSeTlZn, GeSbSeTlSn, and GeSbSeZnSn.

In other example embodiments, the resistive memory pattern 140 may include a material selected from the above two-component to five-component materials and at least one additional element selected from the group consisting of B, C, N, O, P, Cd, W, Ti, Hf, and Zr.

In an embodiment, a bottom surface of the resistive memory pattern 140 contacts the lower barrier 132, and an upper surface of the resistive memory pattern 140 contacts the upper barrier 134. The lower barrier 132 and the upper barrier 134 may each include, for example, a conductive material such as W, WN, WC, or a combination thereof, but embodiments of the inventive concept are not limited thereto.

FIG. 8 illustrates that respective widths of the lower electrode BE, the selection device 124, the intermediate electrode ME, the lower barrier 132, the resistive memory pattern 140, the upper barrier 134, and the upper electrode TE are uniform, embodiments of the inventive concept are not limited thereto. In the first horizontal direction (the X direction) and the second horizontal direction (the Y direction), the widths of the lower electrode BE, the selection device 124, the intermediate electrode ME, the lower barrier 132, the resistive memory pattern 140, the upper barrier 134, and the upper electrode TE may be variously changed, respectively. In example embodiments, the resistive memory device 100 may further include an insulation liner or layer (not shown) that covers side walls of the resistive memory pattern 140. The insulation liner may include a silicon oxide layer, a silicon nitride layer, or a combination thereof.

As shown in FIG. 8, each gap between the first level memory cells MC1 may be filled with a first insulation layer 165A. Each gap between the second level memory cells MC2 may be filled with a second insulation layer 165B. Each gap between the third level memory cells MC3 may be filled with a third insulation layer 165C. Each gap between the fourth level memory cells MC4 may be filled with a fourth insulation layer 165D. The first to fourth insulation layers 165A, 165B, 165C, and 165D may be sequentially and respectively formed on the peripheral circuit structure PCS over the cell array area CA and the cell wire area CB in the vertical direction (the Z direction).

The first to fourth insulation layers 165A, 165B, 165C, and 165D may each include a silicon oxide layer, a silicon nitride layer, SiOC, SiOCH, SiOH, hydrogen silsequioxane-based flowable oxide (HSQ), aluminum oxide, aluminum nitride, zirconium oxide, strontium oxide, lanthanum oxide, yttrium oxide, or a combination thereof. The HSQ may be a material expressed by the chemical formula $(H_2Si_2O_3)_n$, where n is an integer between 3 and 8. In other example embodiments, the first to fourth insulation layers 165A, 165B, 165C, and 165D may each include a seam or an air gap. The term "air" used in the present specification may indicate gases in the air or gases other than those in the air generated during manufacturing processes.

FIG. 8 illustrates that the side wall of each of the lower electrode BE, the selection device 124, the intermediate electrode ME, the lower barrier 132, the resistive memory pattern 140, the upper barrier 134, and the upper electrode TE linearly extend in the vertical direction (the Z direction), but embodiments of the inventive concept are not limited thereto. For example, the side wall of each of the lower electrode BE, the selection device 124, the intermediate electrode ME, the lower barrier 132, the resistive memory pattern 140, the upper barrier 134, and the upper electrode TE may be a tapered side wall. For example, the widths of each of the lower electrode BE, the selection device 124, the intermediate electrode ME, the lower barrier 132, the resistive memory pattern 140, the upper barrier 134, and the upper electrode TE could be different from one another and gradually increase or decrease in a certain direction.

Figure 10:
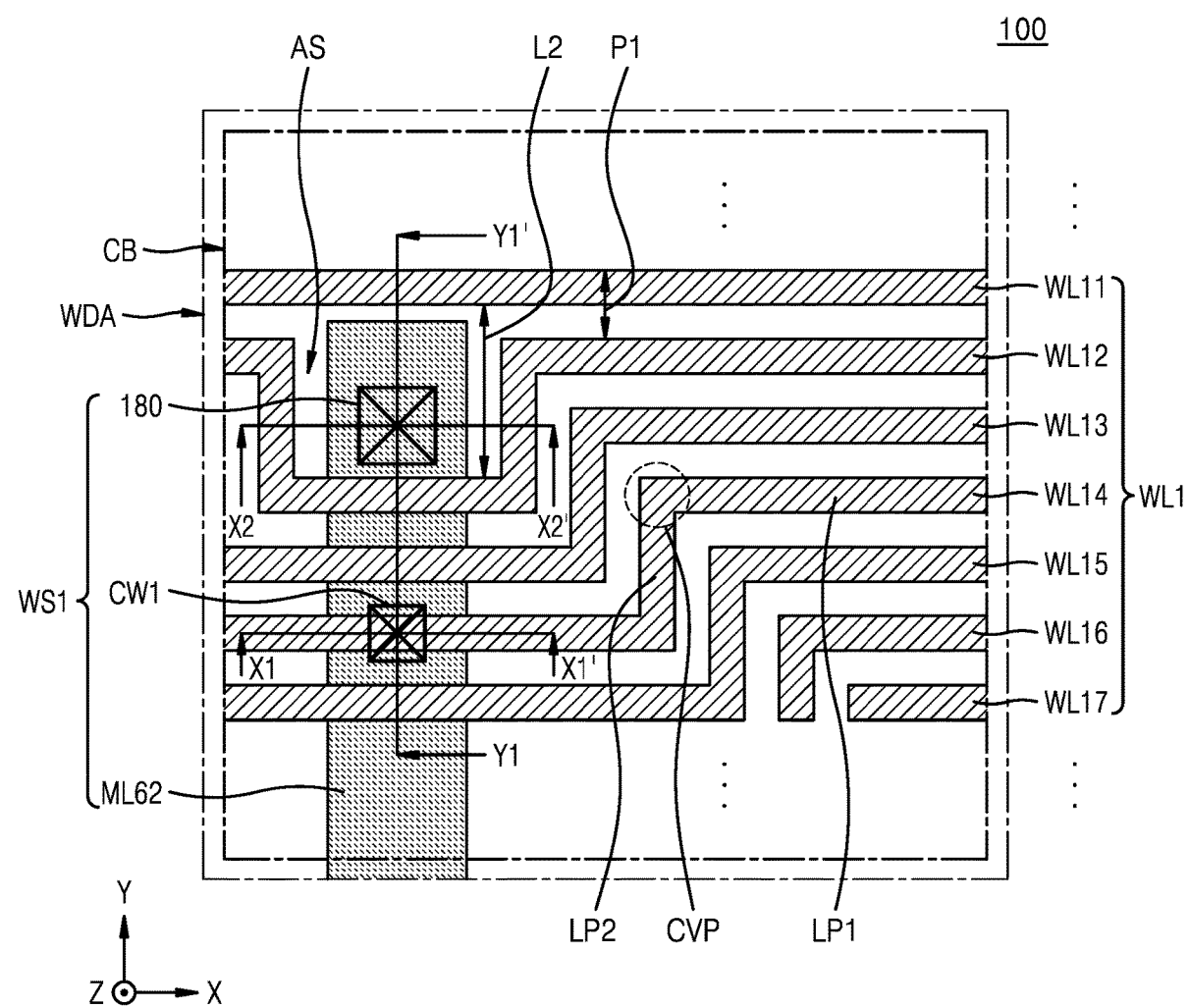
FIGS. 10 and 11 are respectively plan layouts of some components in a cell wire area and a first circuit area included in a resistive memory device, according to an exemplary embodiment of the inventive concept.
Figure 11:
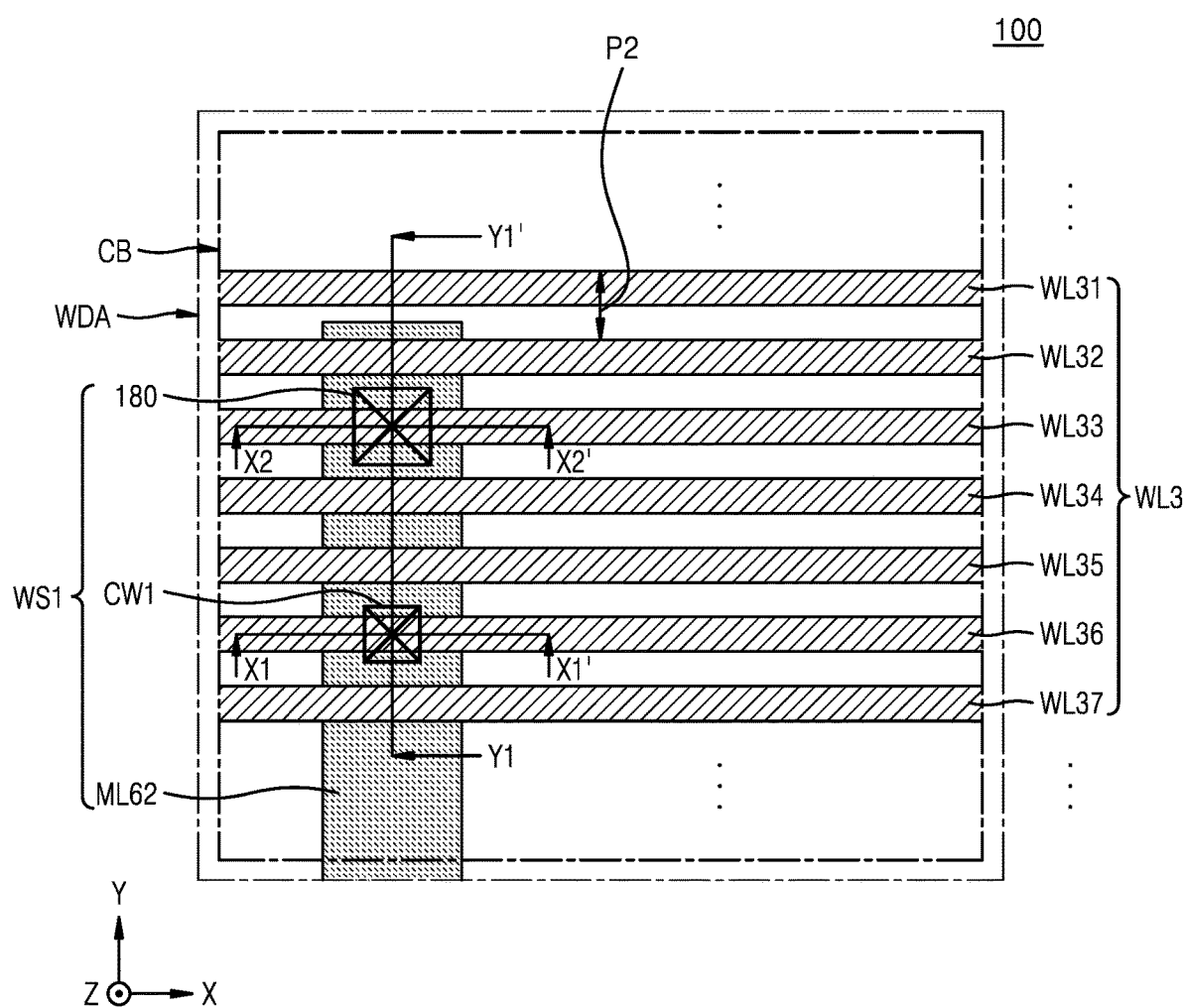
Figure 12:
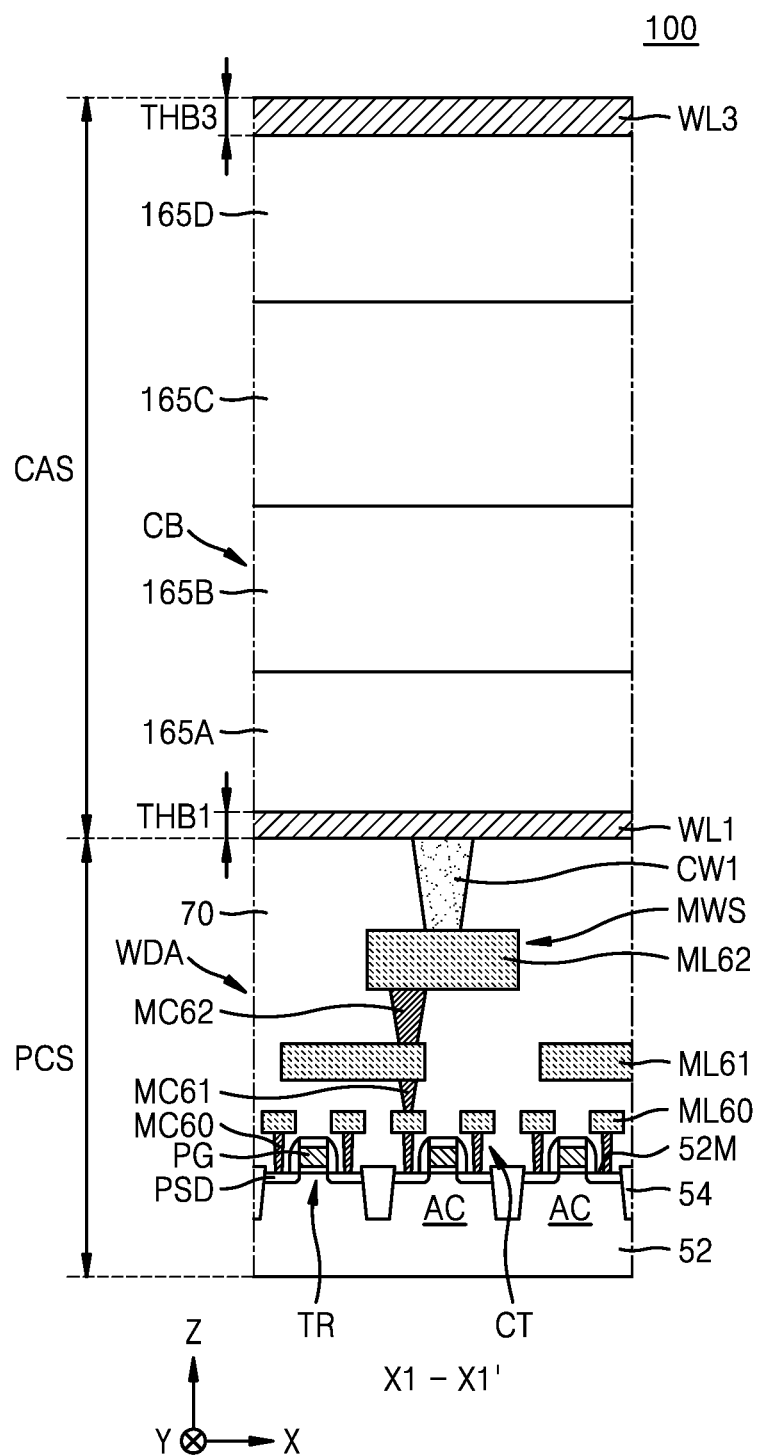
FIG. 12 is a cross-sectional view taken along a line X1-X1' of FIGS. 10 and 11.
Figure 13:
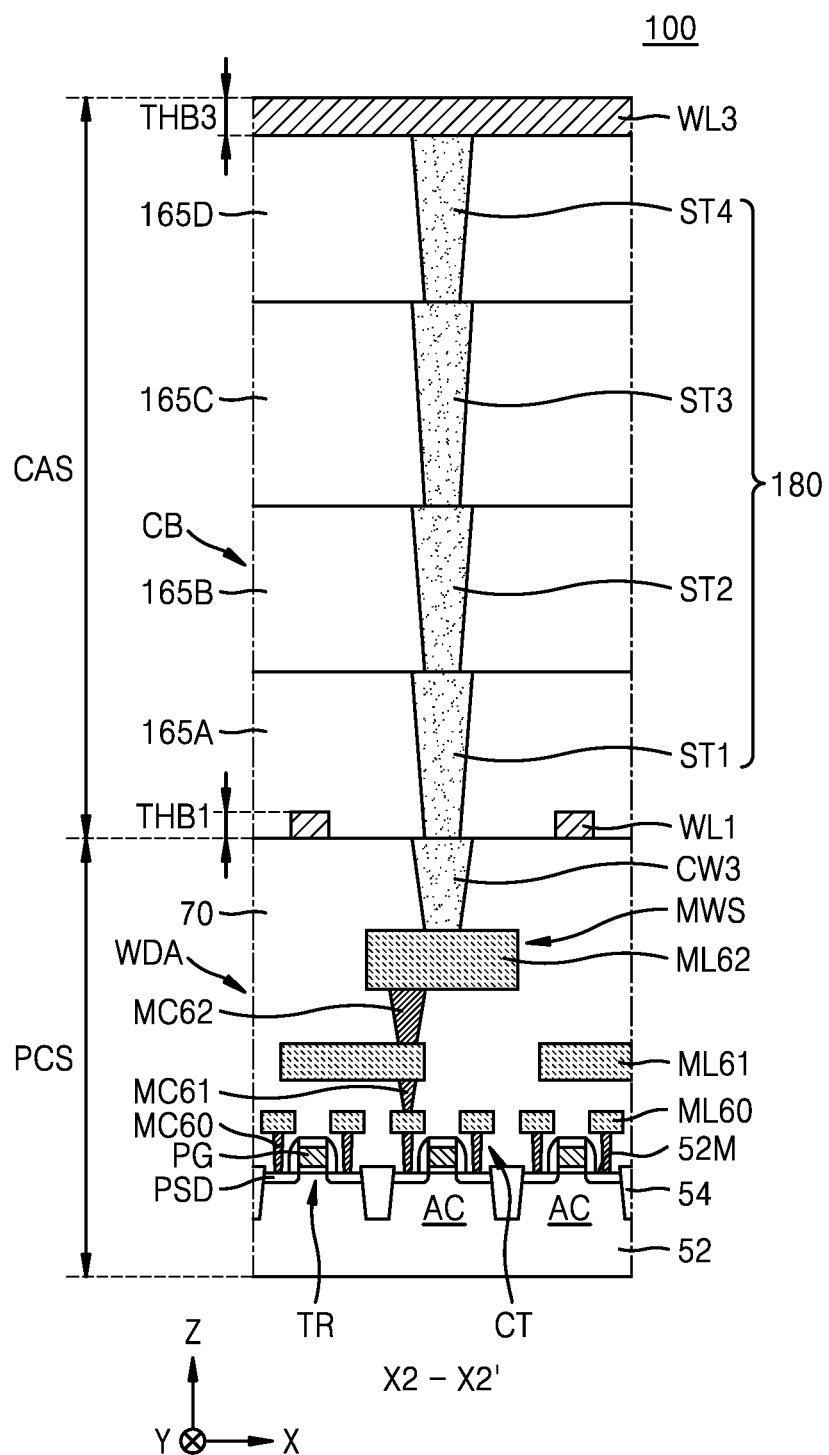
FIG. 13 is a cross-sectional view taken along a line X2-X2' of FIGS. 10 and 11.
Figure 14:
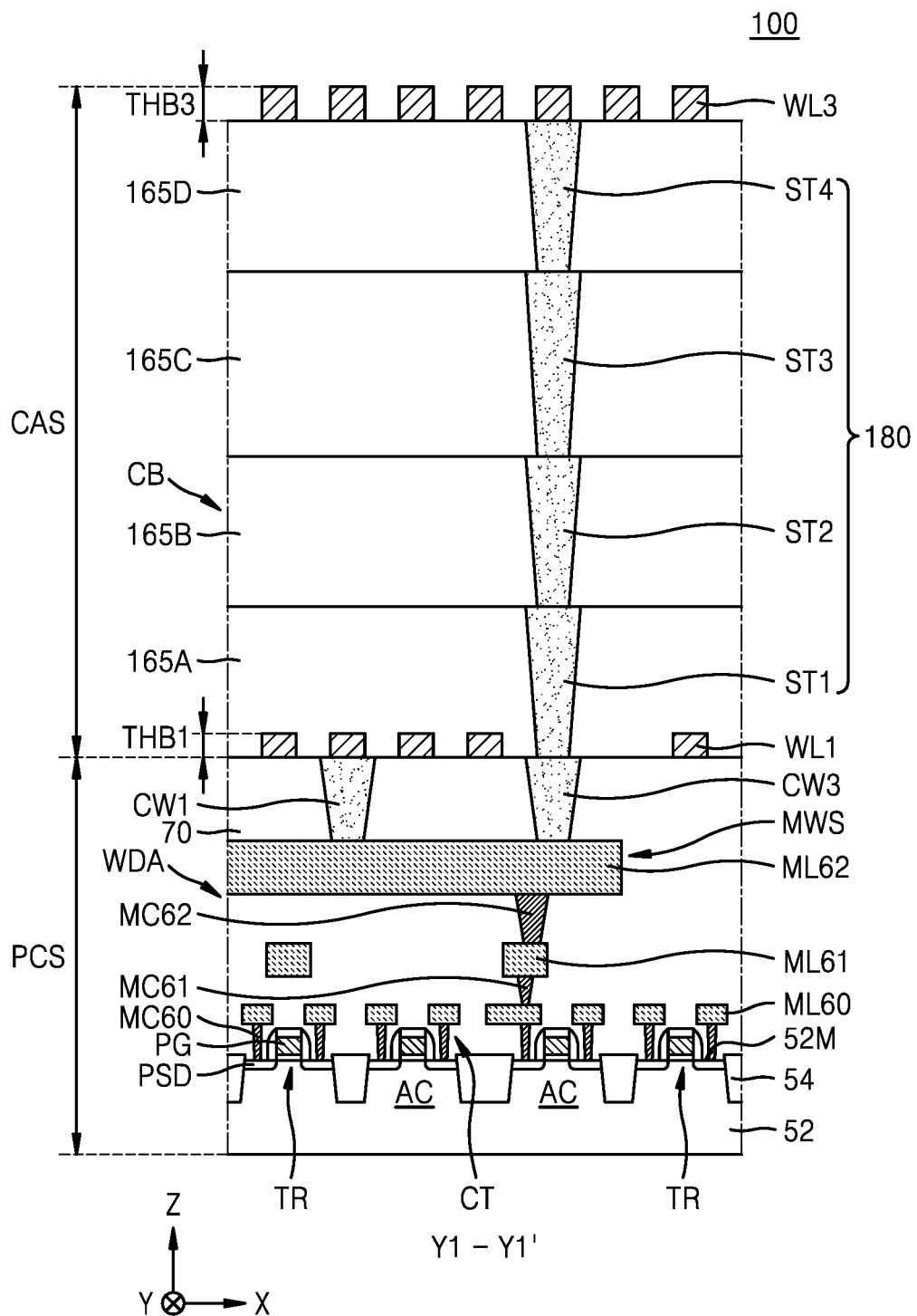
FIG. 14 is a cross-sectional view taken along a line Y1-Y1' of FIGS. 10 and 11.

FIGS. 10 to 14 are diagrams for explaining respective configurations of the cell wire area CB of the cell array structure CAS of the resistive memory device 100 of FIGS. 4 to 7 and the first circuit area WDA on a lower portion of the cell wire area CB of the cell array structure CAS. FIGS. 10 and 11 are plan layouts of some components in the cell wire area CB and the first circuit area WDA thereunder, FIG. 12 is a cross-sectional view taken along a line X1-X1' of FIGS. 10 and 11, FIG. 13 is a cross-sectional view taken along a line X2-X2' of FIGS. 10 and 11, and FIG. 14 is a cross-sectional view taken along a line Y1-Y1' of FIGS. 10 and 11.

As shown in FIG. 10, the first word lines WL1 includes first word lines WL11 to WL17 arranged around a separation space AS in the cell wire area CB of the cell array structure CAS.

In an embodiment, some portions of the cell wire area CB of the cell array structure CAS, the first word lines WL11 to WL17 have uniform first pitches P1 in the second horizontal direction (the Y direction) and linearly extend in the first horizontal direction (the X direction).

In an embodiment, in other portions of the cell wire area CB of the cell array structure CAS, at least some word lines WL12 to WL16 selected from among the first word lines WL1 have at least one curved portion CVP (or an L-shaped portion) to extend by bypassing the separation space AS having a length L2 greater than the first pitches P1 in the second horizontal direction (the Y direction).

The first word line WL11 selected from among the first word lines WL1 may linearly extend in the first horizontal direction (the X direction) at a location adjacent to the separation space AS. The first word lines WL12, WL13, WL14, WL15, and WL16 may include a first local portion LP1 linearly extending in the cell wire area CB of the cell array structure CAS in the first horizontal direction (the X direction), a second local portion LP2 linearly extending in the second horizontal direction (the Y direction), and a curved portion CVP where the first local portion LP1 meets the second local portion LP2.

As illustrated in FIG. 11, the third word lines WL3 include third word lines WL31 to WL37 arranged on an upper portion of the separation space AS in the cell wire area CB of the cell array structure CAS.

In an embodiment, the third word lines WL31 to WL37 have uniform second pitches P2 in the second horizontal direction (the Y direction) and linearly extend in the first horizontal direction (the X direction). In an example embodiment, the first pitch P1 of FIG. 10 has the same size as the second pitch P2 of FIG. 11. In another example embodiment, the first pitch P1 of FIG. 10 has a different size from the second pitch P2 of FIG. 11.

As illustrated in FIGS. 12 to 14, the first to fourth insulation layers 165A, 165B, 165C and 165D are arranged between the first word lines WL1 and the third word lines WL3. As illustrated in FIGS. 8 and 12 to 14, the first to fourth insulation layers 165A, 165B, 165C and 165D may be sequentially formed on the peripheral circuit structure PCS over the cell array area CA and the cell wire area CB in the vertical direction (the Z direction).

As illustrated in FIGS. 10 and 11, the first word lines WL1 and the third word lines WL3 may be connected to the first word line driver WD1 (see FIG. 7) in the first circuit area WDA through a first wire structure WS1.

As illustrated in FIGS. 10 to 14, the first wire structure WS1 may include the multilayer wire structure MWS arranged in the first circuit area WDA of the multilayer wire structure MWS included in the peripheral circuit structure PCS, contact plugs CW1 and CW3 included in the peripheral circuit structure PCS, and a contact structure 180 including contact plugs included in the cell array structure CAS.

The multilayer wire structure MWS of the first wire structure WS1 in the first circuit area WDA may include the peripheral circuit wire layers ML60, ML61 and ML62 and the peripheral circuit contacts MC60, MC61 and MC62.

In an embodiment, the contact plugs CW1 and CW3 of the first wire structure WS1 that are included in the peripheral circuit structure PCS include the contact plug CW1 connected between a selected one of the first word lines WL1 and a selected one of the peripheral circuit wire layers ML62 and the contact plug CW3 connected between the contact structure 180 and the selected peripheral circuit wire layer ML62.

In an embodiment, the contact plug CW1 contacts an upper surface of the selected peripheral circuit wire layer ML62, and the selected first word line WL1 contacts an upper surface of the contact plug CW1.

The contact structure 180 included in the cell array structure CAS may be arranged between the contact plug CW3 and a selected one of the third word lines WL3 and may electrically interconnect the contact plug CW3 to the selected third word line WL3.

The contact plug 180 may include a first contact plug ST1, a second contact plug ST2, a third contact plug ST3, and a fourth contact plug ST4 that are sequentially arranged on the contact plug CW3 in the vertical direction (the Z direction). The first contact plug ST1 may contact the upper surface of the contact plug CW3 by penetrating the first insulation layer 165A in the separation space AS in the vertical direction (the Z direction). The second contact plug ST2 may contact an upper surface of the first contact plug ST1 by penetrating the second insulation layer 165B in the vertical direction (the Z direction). The third contact plug ST3 may contact an upper surface of the second contact plug ST2 by penetrating the third insulation layer 165C in the vertical direction (the Z direction). The fourth contact plug ST4 may contact an upper surface of the third contact plug ST3 by penetrating the fourth insulation layer 165D in the vertical direction (the Z direction). The selected third word line WL3 may contact an upper surface of the fourth contact plug ST4.

The selected third word line WL3 may be connected to the first word line driver WD1 (see FIG. 7) in the first circuit area WDA through the contact structure 180 including the first contact plug ST1 that penetrates the separation space AS in the vertical direction (the Z direction).

In example embodiments, in the cell array structure CAS, the first to fourth contact plugs ST1 to ST4 forming the contact structure 180 and the contact plugs CW1 and CW3 included in the peripheral circuit structure PCS may each include a conductive material such as tungsten, molybdenum, titanium, cobalt, tantalum, nickel, tungsten silicide, titanium silicide, cobalt silicide, tantalum silicide, or nickel silicide.

In an embodiment, the contact structure 180 and the contact plug CW3 contacting the same are separated, in the second horizontal direction (the Y direction), from the contact plug CW1 contacting the selected first word line WL1.

In an example embodiment, in the cell wire area CB, the first word lines WL1 have a first thickness THB1 in the vertical direction (the Z direction), and the third word lines WL3 have a third thickness THB3 greater than the first thickness THB1 in the vertical direction (the Z direction). In an embodiment, the first thickness THB1 is less than the maximum thickness THA1 of the first word lines WL1 described with reference to FIG. 8. The third thickness THB3 may be the same as or similar to the maximum thickness THA3 of the third word lines WL3 described with reference to FIG. 8. In an exemplary embodiment, the third thickness THB3 is less than the maximum thickness THA2 of the second word lines WL2 described with reference to FIG. 8. In other example embodiments, the first word lines WL1 in the cell wire area CB have substantially the same thickness as the maximum thickness THA1 (see FIG. 8) of the first word lines WL1 in the cell array area CA. In another example embodiment, in the cell wire area CB, the third word lines WL3 have substantially the same thickness as the maximum thickness THA3 (see FIG. 8) of the third word lines WL3 in the cell array area CA.

Figure 15:
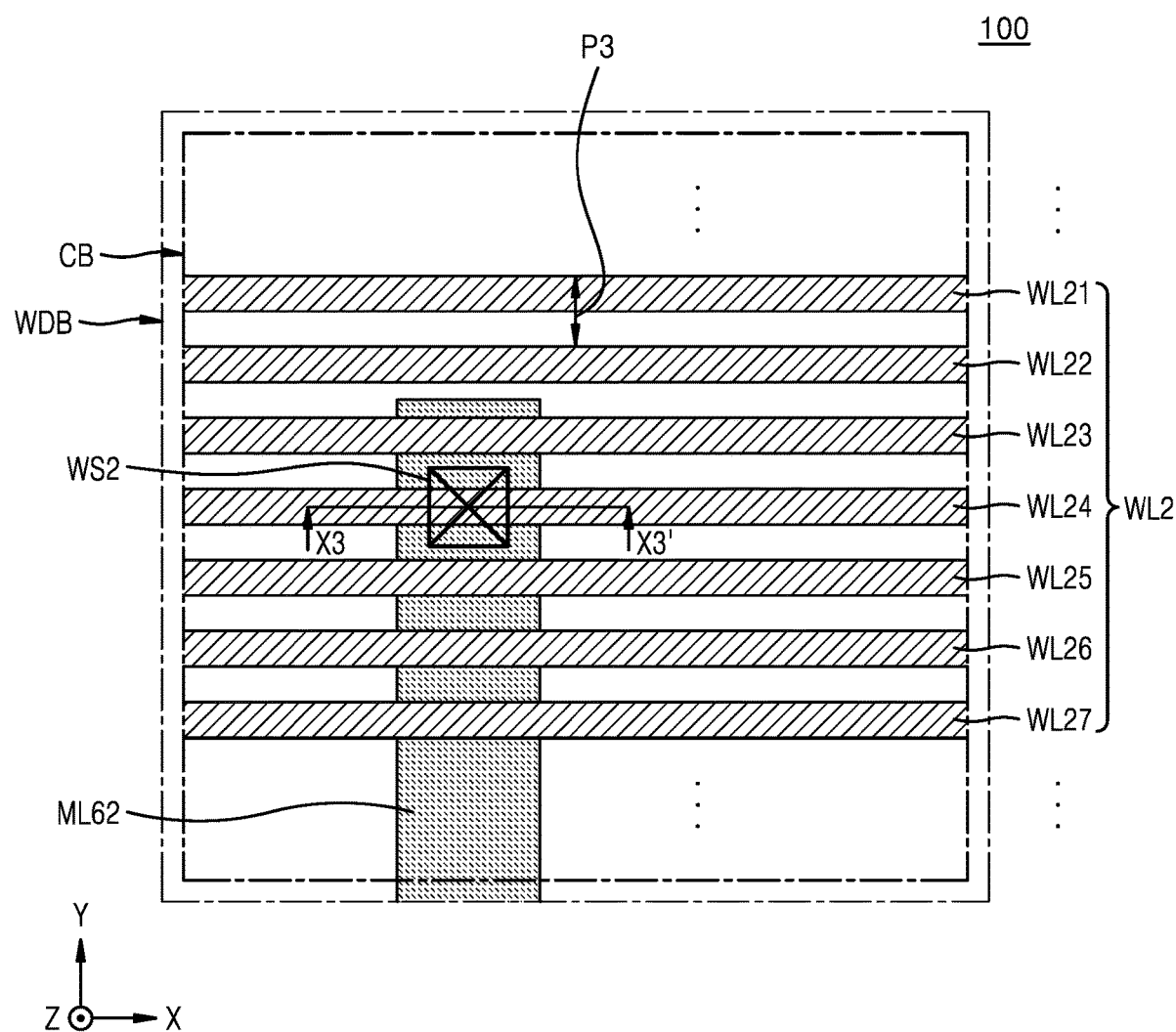
FIGS. 15 and 16 respectively are plan layouts of some components in a cell wire area and a second circuit area included in a resistive memory device, according to an exemplary embodiment of the inventive concept.
Figure 16:
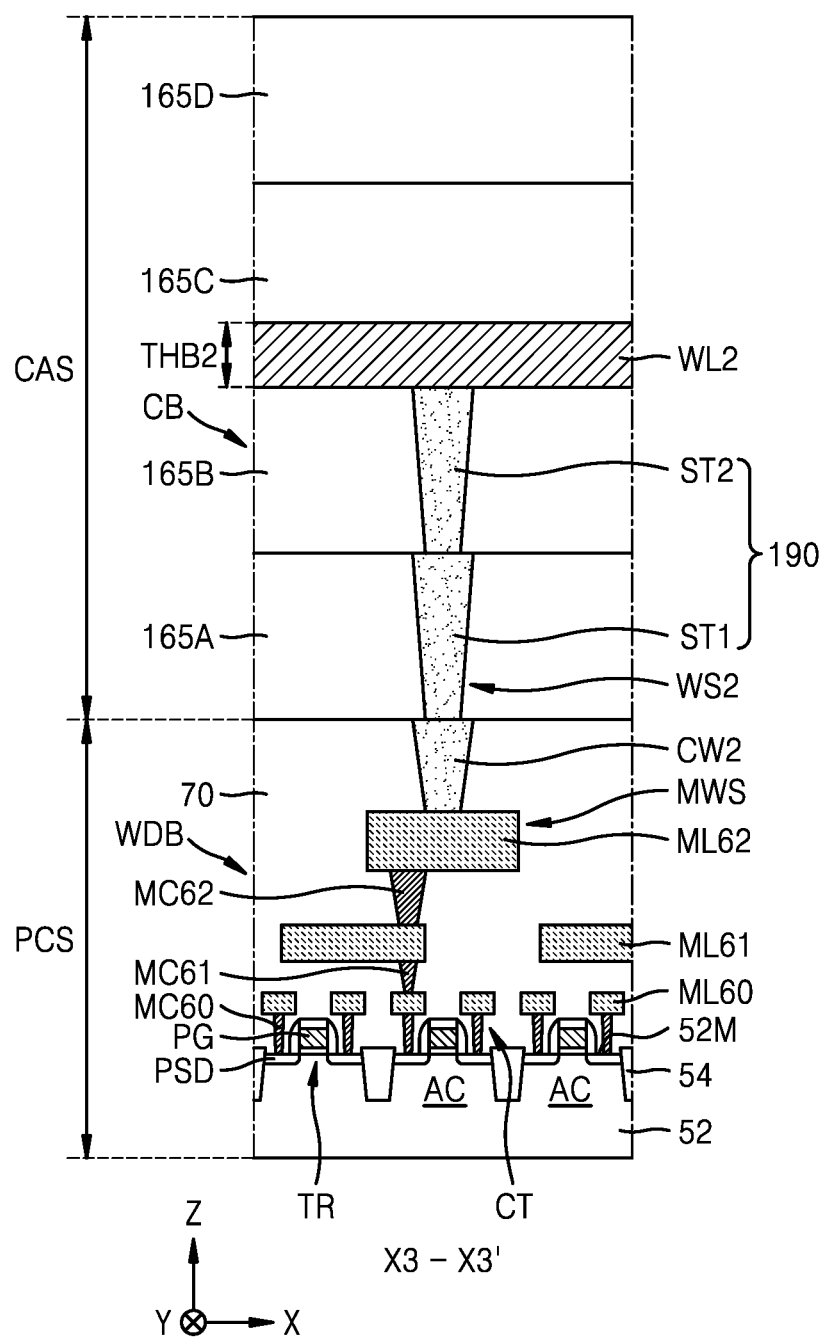

FIGS. 15 and 16 are diagrams for explaining respective configurations of the cell wire area CB of the cell array structure CAS of the resistive memory device 100 of FIGS. 4 to 7 and the second circuit area WDB on a lower portion of the cell wire area CB of the peripheral circuit structure PCS. FIG. 15 is a plan layout of some components in the cell wire area CB and the second circuit area WDB thereunder, and FIG. 16 is a cross-sectional view taken along a line X3-X3' of FIG. 15.

Referring to FIGS. 15 and 16, in the cell wire area CB of the cell array structure CAS, the second word lines WL2 have uniform third pitches P3 in the second horizontal direction (the Y direction) and linearly extend in the first horizontal direction (the X direction).

In an example embodiment, the first pitch P1 of FIG. 10 has the same size as the second pitch P2 of FIG. 11 and the third pitch P3 of FIG. 15. In another example embodiment, at least some of the first pitch P1 of FIG. 10, the second pitch P2 of FIG. 11, and the third pitch P3 of FIG. 15 have different sizes.

As illustrated in FIG. 16, the first and second insulation layers 165A and 165B are arranged between the peripheral circuit structure PCS and the second word lines WL2, and the second word lines WL2 are covered by the third and fourth insulation layers 165C and 165D.

The second word lines WL2 may be connected to the second word line driver WD2 (see FIG. 7) in the second circuit area WDB through a second wire structure WS2.

The second wire structure WS2 may include the multilayer wire structure MWS arranged in the second circuit area WDB of the multilayer wire structure MWS included in the peripheral circuit structure PCS, a contact plug CW2 included in the peripheral circuit structure PCS, and a contact structure 190 including contact plugs included in the cell array structure CAS.

The multilayer wire structure MWS of the second wire structure WS2 in the second circuit area WDB may include the peripheral circuit wire layers ML60 to ML62 and the peripheral circuit contacts MC60 to MC62.

The contact plug CW2 of the second wire structure WS2 in the second circuit area WDB of the peripheral circuit structure PCS may be arranged between a selected one of the second word lines WL2 and a selected one of the peripheral circuit wire layers ML62 and may contact an upper surface of the selected peripheral circuit wire layer ML62. In an exemplary embodiment, the selected peripheral circuit wire layer ML62 in the second circuit area WDB and the selected peripheral circuit wire layer ML62 in the first circuit area WDA are spaced apart from each other in the first horizontal direction (the X direction) and are not electrically connected to each other.

As illustrated in FIG. 16, the contact plug CW2 forming the second wire structure WS2 and the contact structure 190 may overlap each other in the vertical direction (the Z direction). The contact structure 190 included in the cell array structure CAS may be arranged between the contact plug CW2 and the selected second word lines WL2 and may electrically interconnect same.

In an embodiment, the contact structure 190 includes the first contact plug ST1 and the second contact plug ST2 that are sequentially arranged on the contact plug CW2 in the vertical direction (the Z direction). The first contact plug ST1 may contact an upper surface of the contact plug CW2 by penetrating the first insulation layer 165A in the vertical direction (the Z direction). The second contact plug ST2 may contact the upper surface of the first contact plug ST1 by penetrating the second insulation layer 165B in the vertical direction (the Z direction).

Detailed descriptions of the first and second contact plugs ST1 and ST2 forming the contact structure 190 in the cell array structure CAS and the third and fourth contact plugs ST3 and ST4 arranged on the second word lines WL2 are the same as those provided with reference to FIGS. 13 and 14.

In an example embodiment, in the cell wire area CB, the second word lines WL2 has the second thickness THB2 in the vertical direction (the Z direction). In an exemplary embodiment, the second thickness THB2 is less than the maximum thickness THA2 of the second word lines WL2 described with reference to FIG. 8. The second thickness THB2 may be greater than each of the first thickness THB1 and the third thickness THB3 described with reference to FIGS. 12 to 14. In an example embodiment, the second thickness THB2 is about 1.1 to 2 times the first thickness THB1 described with reference to FIGS. 12 to 14, but embodiments of the inventive concept are not limited thereto. In other example embodiments, the second thickness THB2 is about 1.1 to 2 times the third thickness THB3 described with reference to FIGS. 12 to 14, but embodiments of the inventive concept are not limited thereto.

In an example embodiment, in the cell wire area CB, the second word lines WL2 have substantially the same thickness as the maximum thickness THA2 (see FIG. 8) of the second word lines WL2 in the cell array area CA.

In the resistive memory device 100 described with reference to FIGS. 4 to 16, the maximum thickness THA2 of the second word lines WL2 is greater than the maximum thickness THA1 of the first word lines WL1 and the maximum thickness THA3 of the third word lines WL3 in the cell array area CA. Therefore, during the read/write operations of the second level memory cells MC2 and the third level memory cells MC3, a resistance in the second word lines WL2 may relatively decrease. Therefore, a difference between a voltage drop (IR drop) during the read/write operations of the second and third level memory cells MC2 and MC3 and a voltage drop during the read/write operations of the first and fourth level memory cells MC1 and MC4 may be reduced. Therefore, the resistive memory device 100 may secure enough margin for the read/write operations.

Also, the cell array structure CAS of the resistive memory device 100 described with reference to FIGS. 4 to 16 may have a four-stage cross point stack structure including the first to fourth level memory cells MC1 to MC4. The first word lines WL1 and the third word lines WL3 may each be electrically connected to the first word line driver WD1 arranged in the first circuit area WDA of the peripheral circuit structure PCS overlapping the cell array structure CAS in the vertical direction (the Z direction), and the second word lines WL2 may each be electrically connected to the second word line driver WD2 arranged in the second circuit area WDB of the peripheral circuit structure PCS. Therefore, an integration degree of the resistive memory device 100 may be improved, and manufacturing costs per bit of the resistive memory device 100 may decrease.

Figure 17:
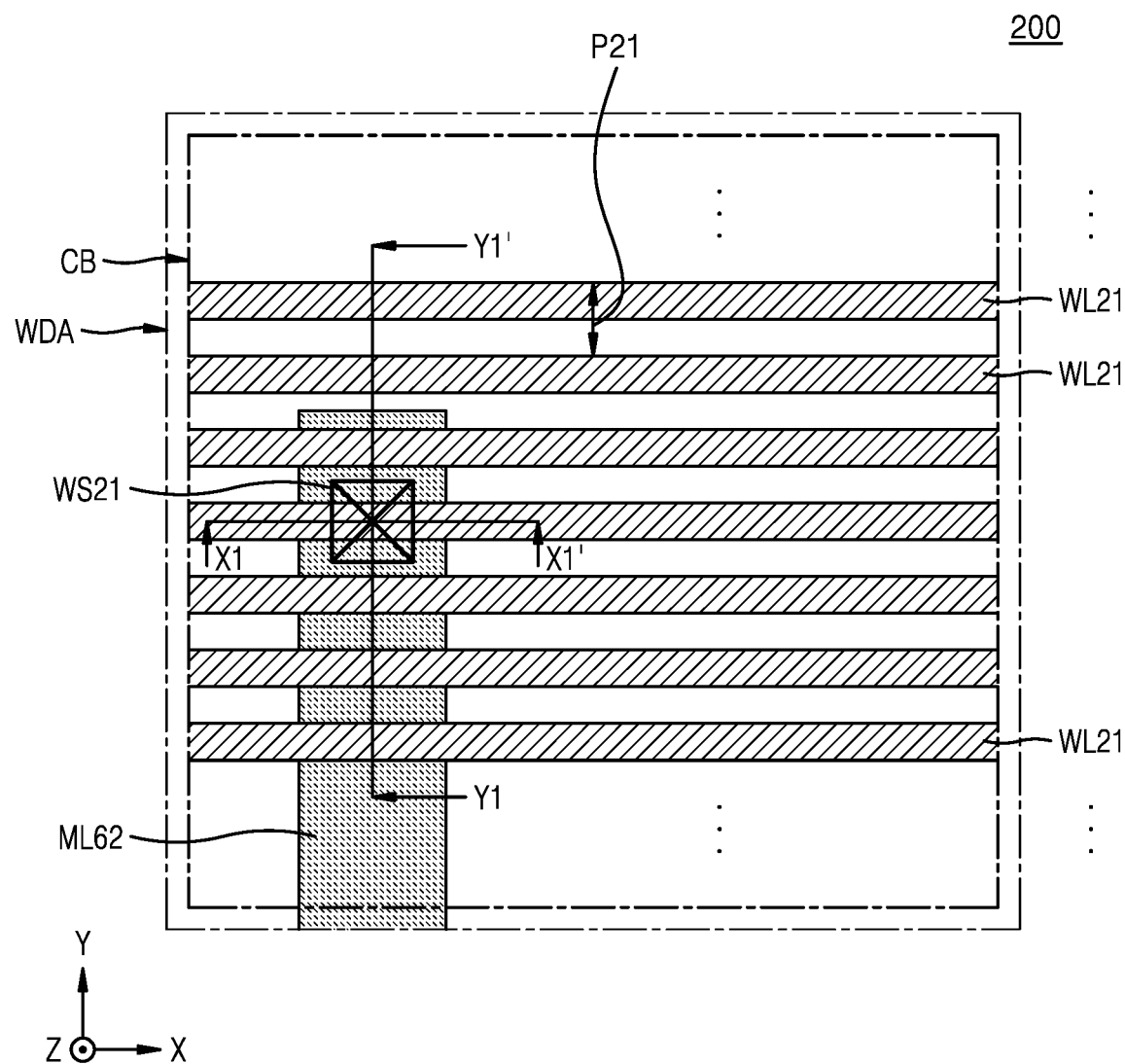
FIGS. 17 and 18 respectively are plan layouts for explaining respective configurations of a cell wire area and a first circuit area included in a resistive memory device, according to an exemplary embodiment of the inventive concept.
Figure 18:
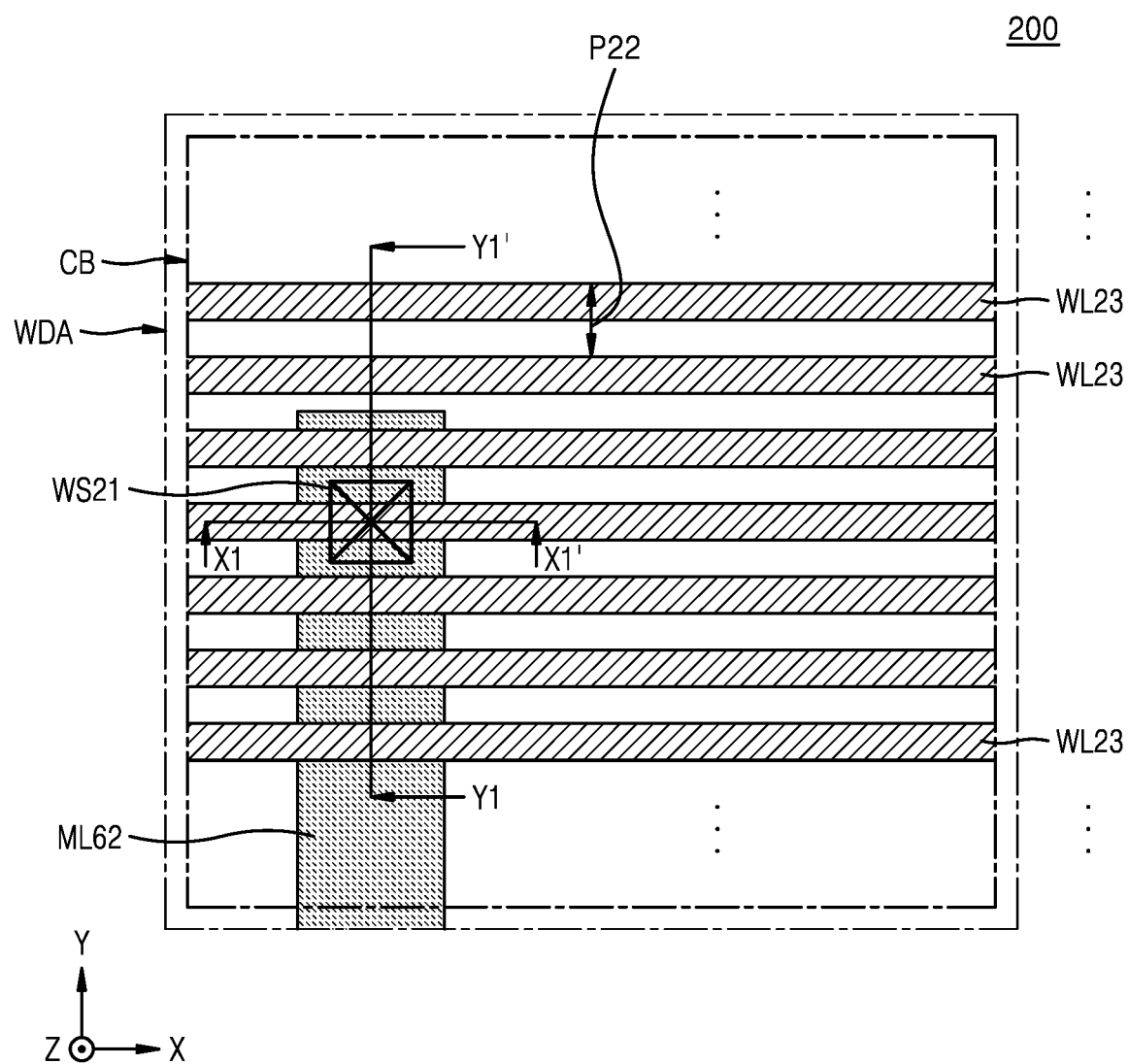
Figure 19:
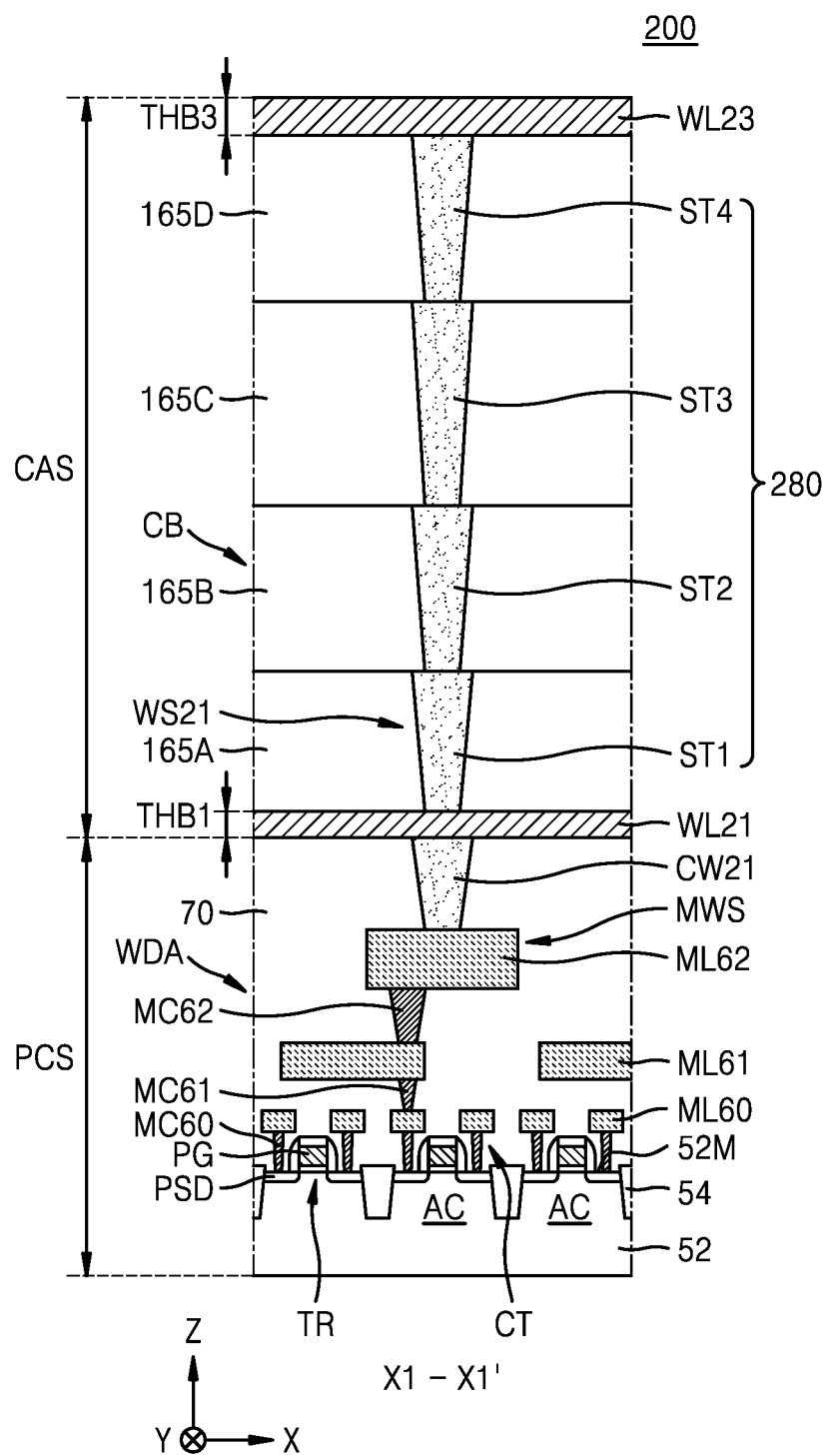
FIG. 19 is a cross-sectional view taken along a line X1-X1' of FIGS. 17 and 18.
Figure 20:
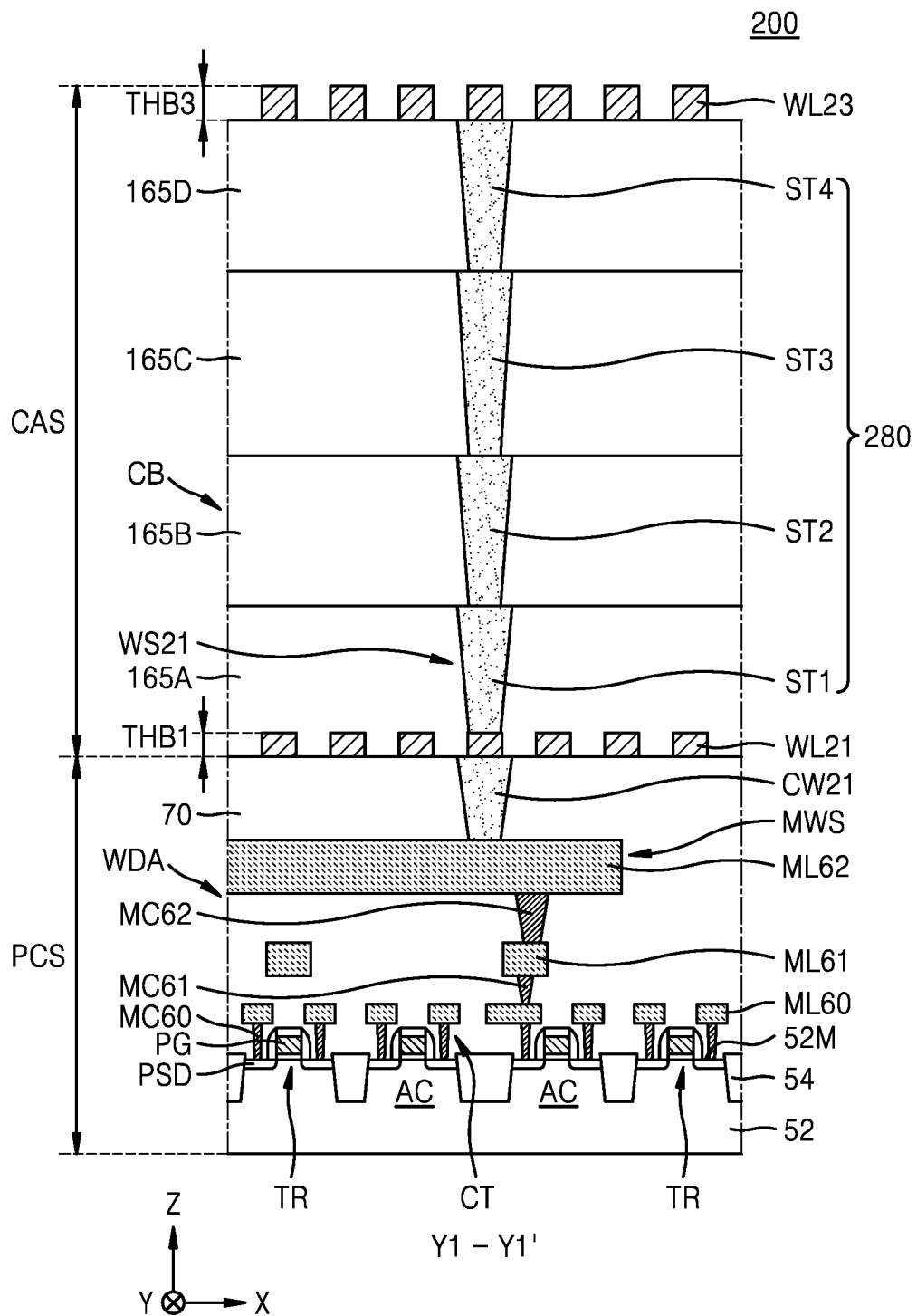
FIG. 20 is a cross-sectional view taken along a line Y1-Y1' of FIGS. 17 and 18.

FIGS. 17 to 20 are diagrams for explaining a resistive memory device 200 according to an exemplary embodiments of the inventive concept. FIGS. 17 and 18 respectively are plan layouts for explaining respective configurations of the cell wire area DB of the cell array structure CAS of the resistive memory device 200 and the first circuit area WDA on a lower portion of the cell wire area CB of the peripheral circuit structure PCS, FIG. 19 is a cross-sectional view taken along a line X1-X1' of FIGS. 17 and 18, and FIG. 20 is a cross-sectional view taken along a line Y1-Y1' of FIGS. 17 and 18.

Referring to FIGS. 17 to 20, the resistive memory device 200 may have approximately the same configuration as the resistive memory device 100 described with reference to FIGS. 4 to 16. However, the resistive memory device 200 includes first word lines WL21 and third word lines WL23 instead of the first and third word lines WL1 and WL3.

In an embodiment, in the cell wire area CB of the cell array structure CAS, the first word lines WL21 have uniform first pitches P21 in the second horizontal direction (the Y direction) and linearly extend in the first horizontal direction (the X direction). In the embodiment, the third word lines WL23 have uniform second pitches P22 in the second horizontal direction (the Y direction) and linearly extend in the first horizontal direction (the X direction). In an exemplary embodiment, the first pitches P21 and the second pitches P22 are identical or similar to each other.

As illustrated in FIGS. 19 and 20, the first to fourth insulation layers 165A to 165D may be arranged in gaps between the first and third word lines WL21 and WL23.

The first and third word lines WL21 and WL23 may be connected to the first word line driver WD1 (see FIG. 7) in the first circuit area WDA through a wire structure WS21.

As illustrated in FIGS. 19 and 20, the wire structure WS21 includes a multilayer wire structure MWS arranged in the first circuit area WDA of the multilayer wire structure MWS included in the peripheral circuit structure PCS, a contact plug CW21 included in the peripheral circuit structure PCS, and a contact structure 280 including contact plugs included in the cell array structure CAS.

The multilayer wire structure MWS of the wire structure WS21 in the first circuit area WDA may include the peripheral circuit wire layers ML60 to ML62 and the peripheral circuit contacts MC60 to MC62.

The contact plug CW21 of the wire structure WS21 that is included in the peripheral circuit structure PCS may be connected between a selected one of the first wire lines WL21 and a selected one of the peripheral circuit wire lines WL62. In an embodiment, the contact plug CW21 contacts an upper surface of the selected peripheral circuit wire layer ML62, and the selected first word line WL21 contacts an upper surface of the contact plug CW21.

In an embodiment, the contact structure 280 included in the cell array structure CAS is arranged between and electrically connects the contact plug CW21 and a selected one of the third word lines WL23. The contact structure 280 may include the first to fourth contact plugs ST1 to ST4 sequentially arranged on the contact plug CW21 in the vertical direction (the Z direction). Detailed configurations of the first to fourth contact plugs ST1 to ST4 are the same as those described with reference to FIGS. 13 and 14.

The selected third word line WL23 may be connected to the selected first word line WL21 through the contact structure 280. The contact plug CW21 and the contact structure 280 may overlap each other in the vertical direction (the Z direction).

Detailed configurations of the first and third word lines WL21 and WL23 are substantially the same as those of the first and third word lines WL1 and WL3 described with reference to FIGS. 8 to 14.

The resistive memory device 200 may further include the second word line WL2 having the same structure described with reference to FIGS. 15 and 16 and the second wire structure WS2.

Figure 21:
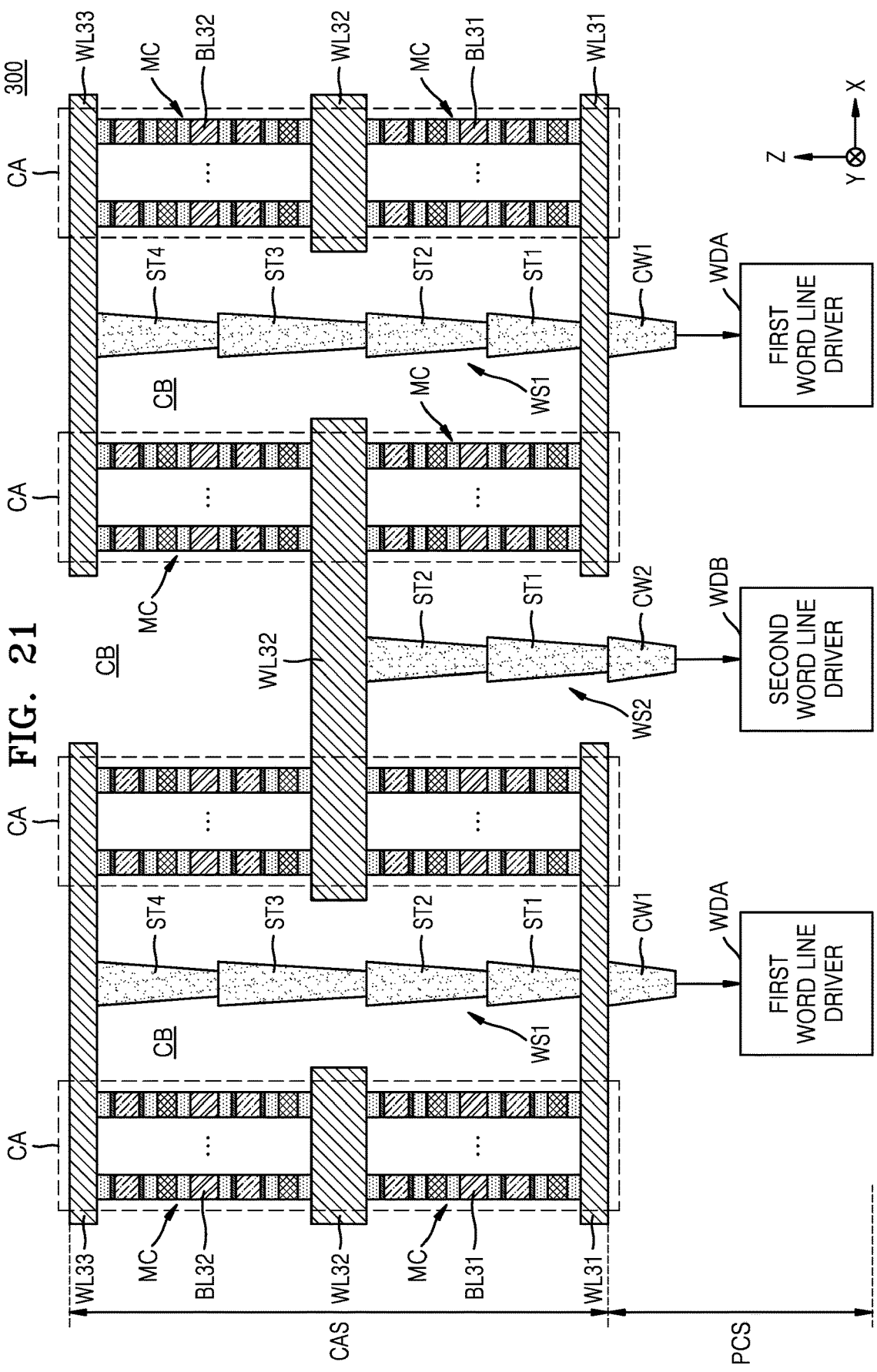
FIGS. 21 and 22 are schematic cross-sectional views of a resistive memory device according to an exemplary embodiment of the inventive concept.
Figure 22:
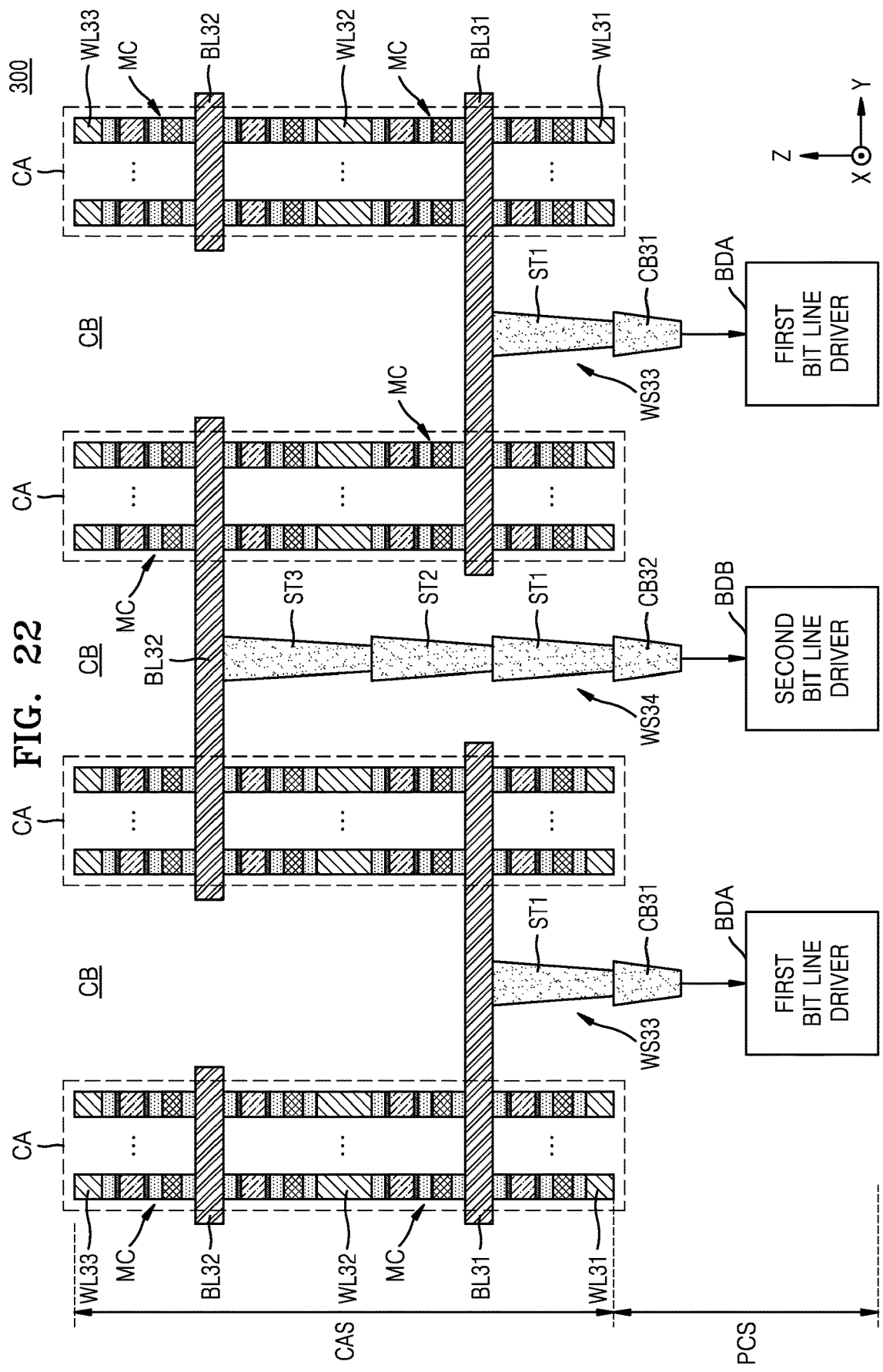

FIGS. 21 and 22 are schematic cross-sectional views of a resistive memory device 300 according to an exemplary embodiment of the inventive concept.

Referring to FIGS. 21 and 22, a resistive memory device 300 may have substantially the same structure as the resistive memory device 100 described with reference to FIGS. 4 to 16 or the resistive memory device 200 described with reference to FIGS. 17 to 20. The cell array structure CAS of the resistive memory device 300 may include cell array areas, which are arranged in series and spaced apart from each other in the first horizontal direction (the X direction) and the second horizontal direction (the Y direction), and cell wire areas CB respectively surrounding the cell array areas CA. Detailed configurations of the cell array areas CA and the cell wire areas CB are the same as those described with reference to FIGS. 4 to 16.

The cell array structure CAS of the resistive memory device 300 includes first word lines WL31, first bit lines BL31, second word lines WL32, second bit lines BL32, and third word lines WL33 sequentially stacked in the cell array areas CA in the vertical direction (the Z direction).

The first word lines WL31, the first bit lines BL31, the second word lines WL32, the second bit lines BL32, and the third word lines WL33 may have substantially the same configurations as the first word lines WL1, the first bit lines BL1, the second word lines WL2, the second bit lines BL2, and the third word lines WL3 described with reference to FIGS. 4 to 16. As illustrated in FIG. 21, the first word lines WL31, the second word lines WL32, and the third word lines WL33 each extend in the first horizontal direction (the X direction) to pass two cell array areas CA, which are adjacent to each other in the first horizontal direction (the X direction), and the cell wire area CB between the cell array areas CA. For example, the first word lines WL31 and the third word lines WL33 may overlap a pair of cell array areas CA with a cell wire area CB located between the pair. In an embodiment, the first word lines WL31 and the third word lines WL33 are not offset in the first horizontal direction (the X direction) and overlap each other in the vertical direction (the Z direction). In an embodiment, the first word lines WL31 and the second word lines WL32 are offset in opposite directions from the first horizontal direction (the X direction), and thus only some of the first word lines WL31 and the second word lines WL32 overlap in the vertical direction (the Z direction). In an embodiment, the second word lines WL32 and the third word lines WL33 are offset in opposite directions from the first horizontal direction (the X direction), and thus, only some of the second word lines WL32 and the third word lines WL33 overlap in the vertical direction (the Z direction).

The first and third word lines WL31 and WL33 overlapping in the vertical direction (the Z direction) may be connected to a first word line driver in the first circuit area WDA of the peripheral circuit structure PCS through the first wire structure WS1. The second word lines WL32 may be connected to the second word line driver in the second circuit area WDB of the peripheral circuit structure PCS through the second wire structure WS2. Detailed configurations of the first wire structure WS1 and the second wire structure WS2 are the same as those described with reference to FIGS. 10 to 16.

Also, as illustrated in FIG. 22, the first bit lines BL31 and the second bit lines BL32 each extend in the second horizontal direction (the Y direction) to pass two cell array areas CA, which are adjacent to each other in the second horizontal direction (the Y direction), and the cell wire area CB between the cell array areas CA. In an embodiment, some of the first bit lines BL31 overlap first and second cell array areas and some of the second bit lines BL32 overlap the second cell array and a third cell array area. In an embodiment, the first bit lines BL31 and the second bit lines BL32 are offset in opposite directions from the second horizontal direction (the Y direction), and only some of the first bit lines BL31 and the second bit lines BL32 overlap in the vertical direction (the Z direction).

The first bit lines BL31 may each be connected to the first bit line driver in the third circuit area BDA of the peripheral circuit structure PCS through a third wire structure WS33. The second bit lines BL32 may each be connected to the second bit line driver in the fourth circuit area BDB of the peripheral circuit structure PCS through a fourth wire structure WS34.

The third wire structure WS33 may include a contact plug CB31 included in the peripheral circuit structure PCS and the first contact plug ST1 included in the cell array structure CAS. In an embodiment, the first bit lines BL31 each contact an upper surface of the first contact plug ST1. The fourth wire structure WS34 may include a contact plug CB32 included in the peripheral circuit structure PCS and the first to third contact plugs ST1 to ST3 included in the cell array structure CAS. In an embodiment, the second bit lines BL32 each contact an upper surface of the third contact plug ST3. Detailed configurations of the first to third contact plugs ST1 to ST3 are approximately the same as those described with reference to FIGS. 13 and 14.

Similar to the descriptions regarding the first word lines WL21 and the third word lines WL23 included in the resistive memory device 200 of FIGS. 17 to 20, FIG. 21 illustrates that the third word lines WL33 are connected to the first word line driver WD1 (see FIG. 7) in the first circuit area WDA via the first wire structure WD1, the first word lines WL31, and the contact plug CW, but embodiments of the inventive concept are not limited thereto. For example, similar to the descriptions regarding the first word lines WL1 and the third word lines WL3 included in the resistive memory device 100 of FIGS. 10 to 14, the third word lines WL33 may be separated from the first word lines WL31 in the second horizontal direction (the Y direction) and connected to the first word line driver WD1 (see FIG. 7) in the first circuit area WDA through a wire structure (not shown) that vertically penetrates, in the vertical direction (the Z direction), a separation space having a relatively great area and defined in a local region between the first word lines WL31.

According to the resistive memory devices 100 to 300 described with reference to FIGS. 4 to 22, the second word lines WL2 and WL32, which are respectively connected to the second level memory cells MC2 and the third level memory cells MC3, may have greater thicknesses than the first word lines WL1, WL21, and WL31 and the third word lines WL3, WL23, and WL33. Accordingly, during the read/write operations of the second level memory cells MC2 and the third level memory cells MC3, the resistance of the second word lines WL2 and WL32 may be relatively reduced. Therefore, a difference between a voltage drop during the read/write operations of the second level memory cells MC2 and the third level memory cells MC3 and a voltage drop during the read/write operations of the first level memory cells MC1 and the fourth level memory cells MC4 may be reduced. Therefore, a resistive memory device for securing enough margin for the read/write operations may be provided.

Also, the cell array structures CAS of the resistive memory devices 100 to 300 described with reference to FIGS. 4 to 22 may each have a four-stage cross point stack structure including the first to fourth level memory cells MC1 to MC4. The first word lines WL1, WL21, and WL31 and the third word lines WL3, WL23, and WL33 may each be electrically connected to the first word line driver WD1 in the first circuit area WDA of the peripheral circuit structure PCS overlapping the cell array structure CAS in the vertical direction (the Z direction), and the second word lines WL2 and WL32 may each be electrically connected to the second word line driver WD2 in the second circuit area WDB of the peripheral circuit structure PCS. Therefore, the integration degrees of the resistive memory devices 100 to 300 may be improved, and the manufacturing costs per bit of the resistive memory devices 100 to 300 may be reduced.

FIGS. 23A to 26C are cross-sectional views for explaining an exemplary manufacturing method of a resistive memory device, according to an embodiment of the inventive concept. In more detail, similar to the illustration of FIG. 8, FIGS. 23A, 24A, 25A, and 26A are cross-sectional views according to a process order of some areas of each of the cell array area CA of the cell array structure CAS of the resistive memory device 100 and the first circuit area WDA of the peripheral circuit structure PCS on a lower portion of the cell array area CA. FIGS. 23B, 24B, 25B, and 26B are cross-sectional views according to a process order of some areas of each of the cell wire area CB of the cell array structure CAS and the first circuit area WDA of the peripheral circuit structure PCS on the lower portion of the cell wire area CB. Similar to the illustration of FIG. 13, FIGS. 23B, 24B, 25B, and 26B illustrate some configurations according to a process order of an area corresponding to a cross-section taken along a line X2-X2' of FIGS. 10 and 11. FIGS. 23C, 24C, 25C, and 26C are cross-sectional views according to a process order of some areas of each of the cell wire area CB of the cell array structure CAS and the second circuit area WDB of the peripheral circuit structure PCS arranged on the lower portion of the cell wire area CB. Similar to the illustration of FIG. 16, FIGS. 23C, 24C, and 26C illustrate some configurations according to a process order of an area corresponding to a cross-section taken along a line X3-X3' of FIG. 15. An exemplary manufacturing method of the resistive memory device 100 of FIGS. 4 to 16 is described with reference to FIGS. 23A to 26C.

Figure 23A:
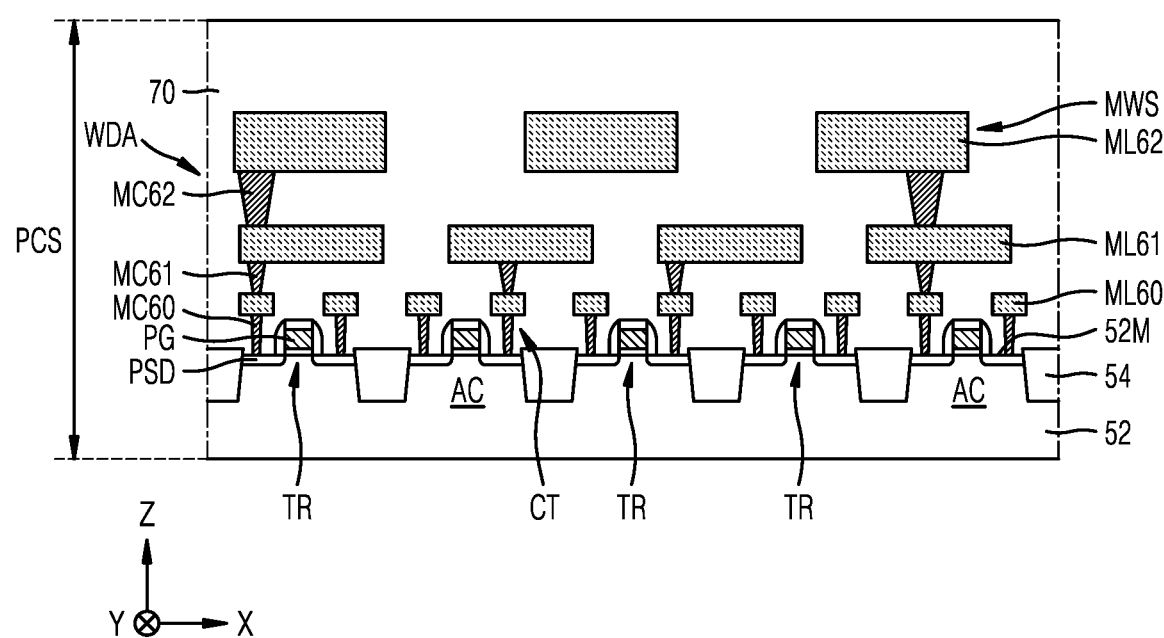
Figure 23B:
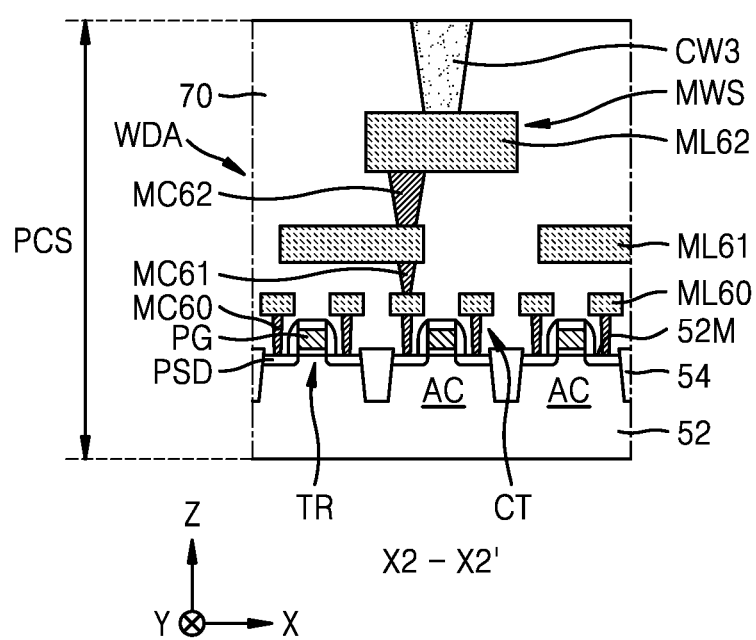
FIGS. 23B, 24B, 25B, and 26B are cross-sectional views of some components according to a process order of an area corresponding to a cross-section taken along a line X2-X2' of FIGS. 10 and 11, and FIGS. 23C, 24C, 25C, and 26C are cross-sectional views of some components according to a process order of an area according to a cross-section taken along a line X3-X3' of FIG. 15.
Figure 23C:
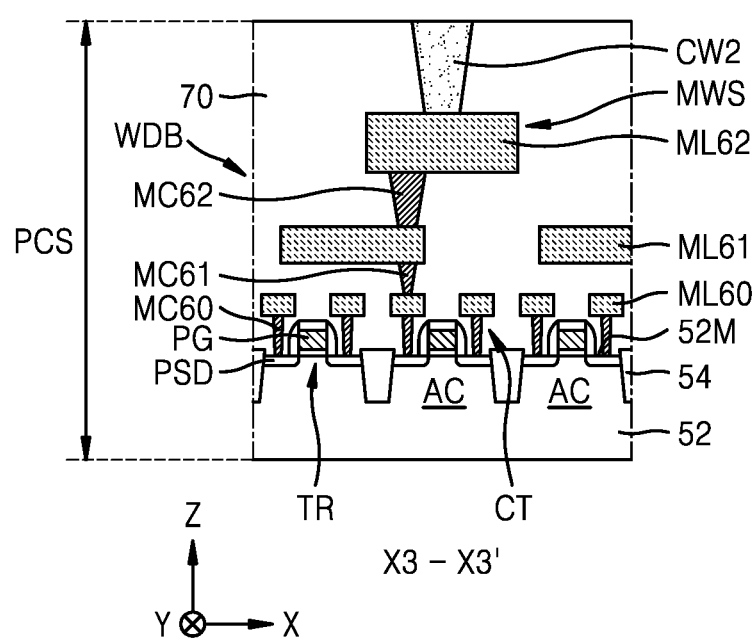

Referring to FIGS. 23A to 23C, the peripheral circuit structure PCS including the lower substrate 52, the transistors TR, the multilayer wire structure MWS, and the interlayer insulating layer 70 is formed. The peripheral circuit structure PCS may include the circuits CT and the multilayer wire structure MWS.

The circuits CT of the peripheral circuit structure PCS may include various circuits included in the peripheral circuit 30 described with reference to FIG. 1. The peripheral circuit structure PCS may include the first to fourth circuit areas WDA, WDB, BDA, and BDB described with reference to FIGS. 4, 5, and 7, and the first to fourth circuit areas WDA, WDB, BDA, and BDB may respectively include the first word line driver WD1, the second word line driver WD2, the first bit line driver BD1, and the second bit line driver BD2 described with reference to FIG. 7.

As illustrated in FIGS. 23B and 23C, the multilayer wire structure MWS of the peripheral circuit structure PCS includes the contact plugs CW2 and CW3 connected to the upper surface of the peripheral circuit wire layer ML62. While the contact plugs CW2 and CW3 are formed, the contact plug CW1 of FIGS. 12 and 14 may also be formed.

Figure 24A:
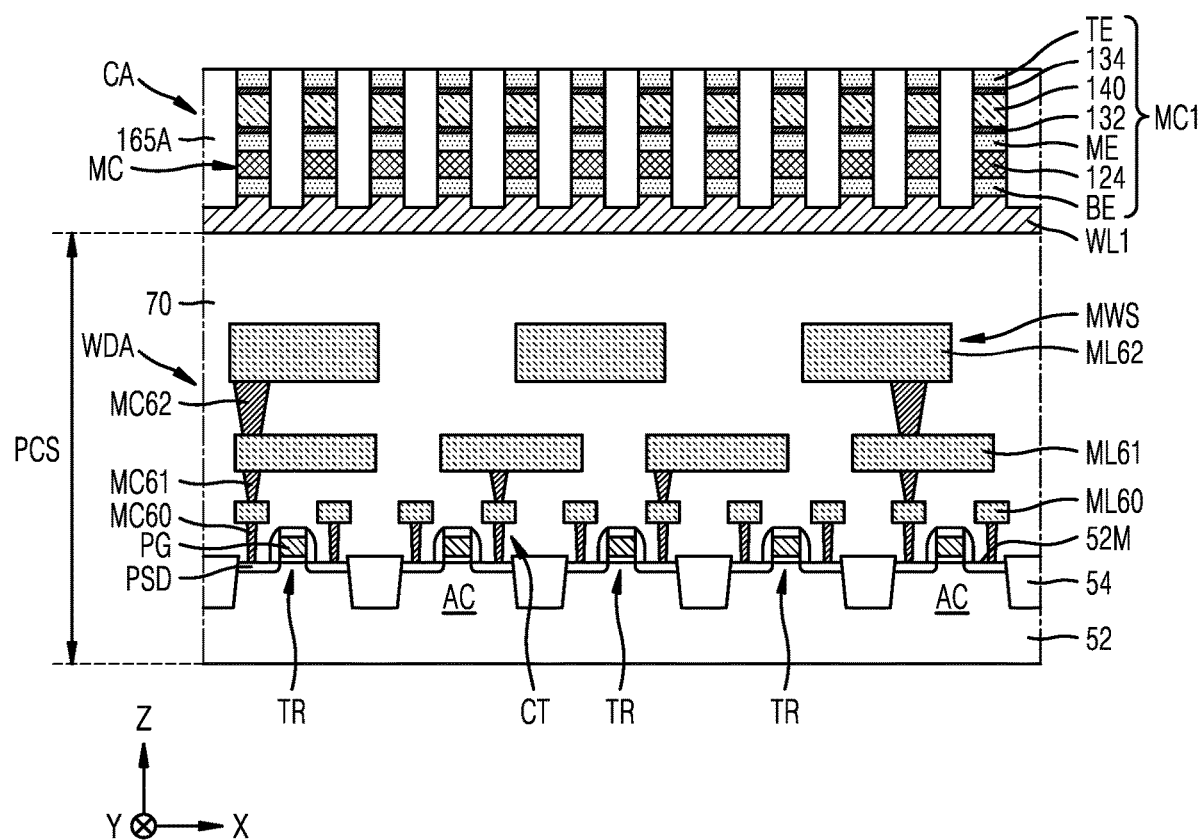
Figure 24B:
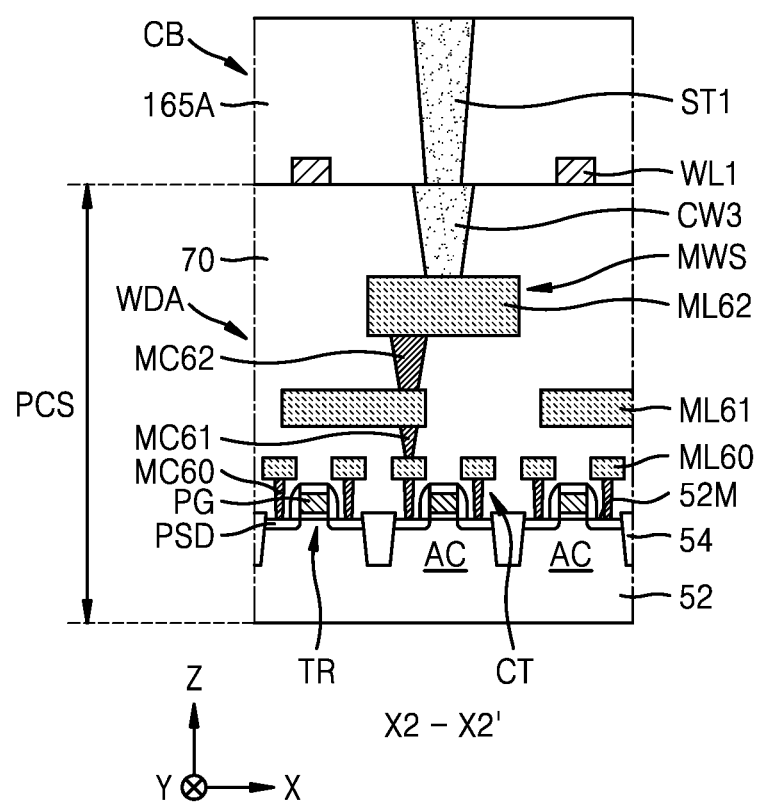
Figure 24C:
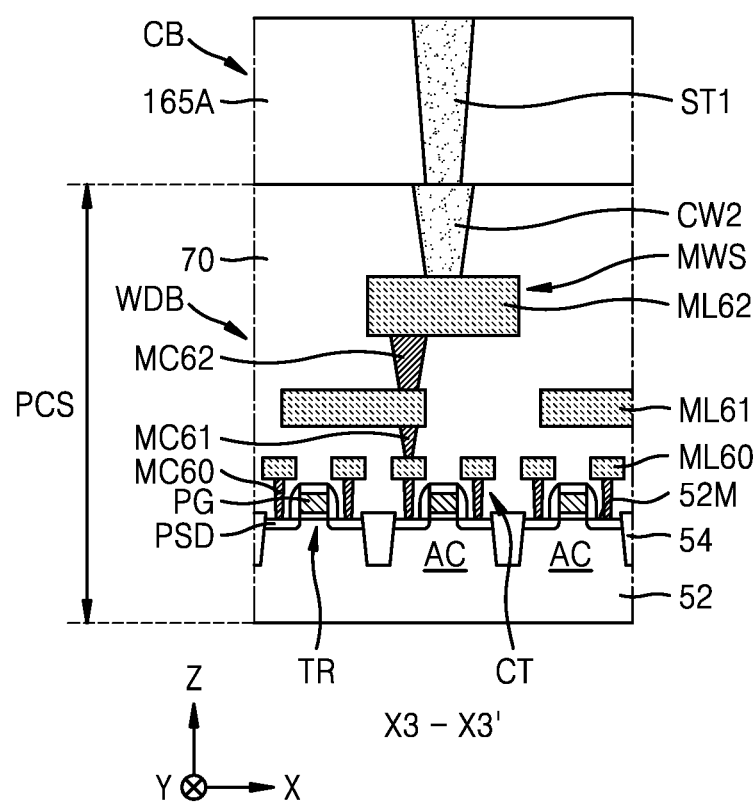

Referring to FIGS. 24A, 24B, and 24C, the first word lines WL1 (see FIGS. 10 and 14) are formed in the cell array area CA and the cell wire area CB on the peripheral circuit structure PCS, and the first level memory cells MC1 are formed on the first word lines WL1 in the cell array area CA.

In an example embodiment, during an etching process of forming the first level memory cells MC1, some portions of the first word lines WL1 are exposed to an etching atmosphere during the etching process in the cell array area CA and the cell wire area CB. As a result, in the cell array area CA, upper levels of some portions of the first word lines WL1 decrease. Thus, the upper surface of each first word line WL1 may extend unevenly in the first horizontal direction (the X direction). The first word lines WL1 may be exposed to an etching atmosphere in the cell wire area CB. As a result, the first thickness THB1 of the first word lines WL1 in the cell wire area CB may be less than the maximum thickness THA1 (see FIG. 8) of the first word lines WL1 in the cell array area CA, as described with reference to FIG. 12. In another example embodiment, while the etching process of forming the first level memory cells MC1 is performed, thicknesses of the first word lines WL1 are not changed in the cell array area CA and the cell wire area CB.

Then, the first insulation layer 165a is formed to fill respective gaps between the first level memory cells MC1 in the cell array area CA and to cover the first word lines WL1 and the peripheral circuit structure PCS in the cell wire area CB. The contact plugs ST1, which are respectively connected to the contact plugs CW2 and CW3 are formed by penetrating the first insulation layer 165A in the vertical direction (the Z direction).

Figure 25A:
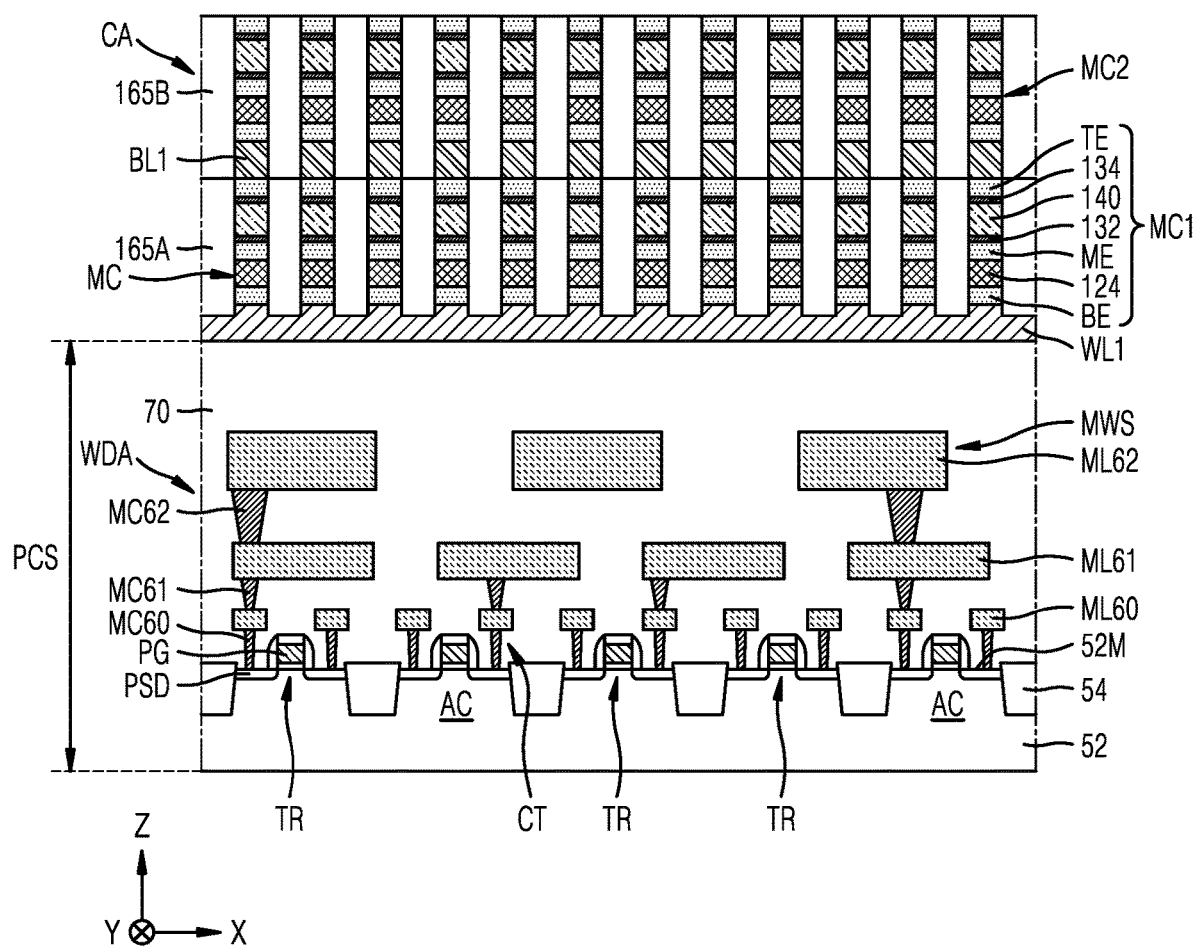
Figure 25B:
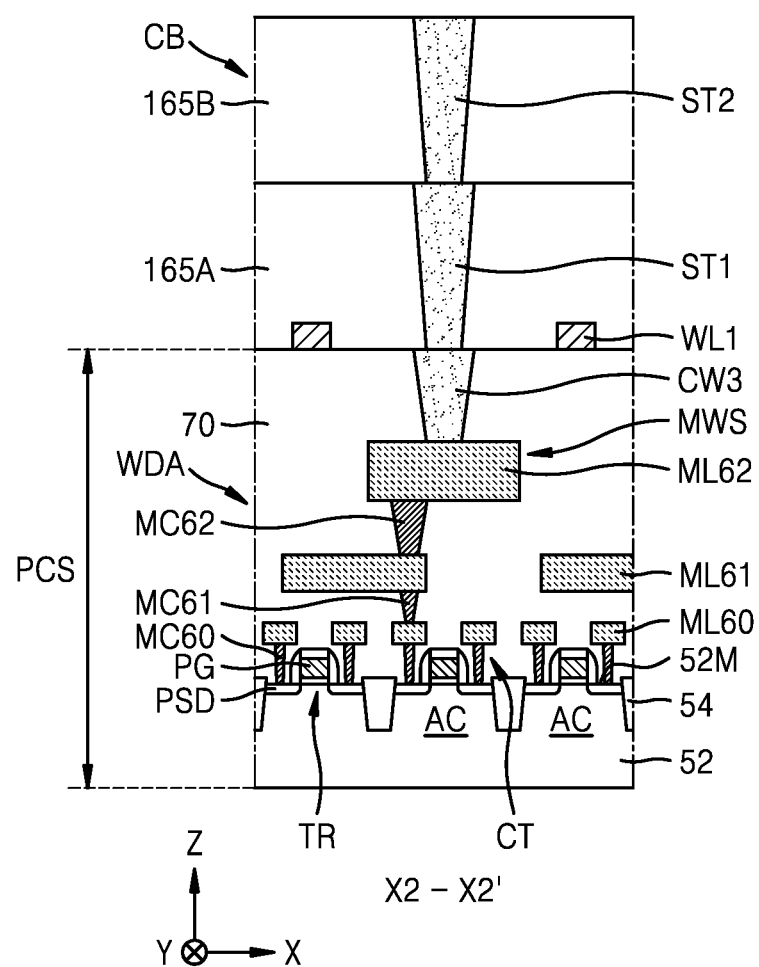
Figure 25C:
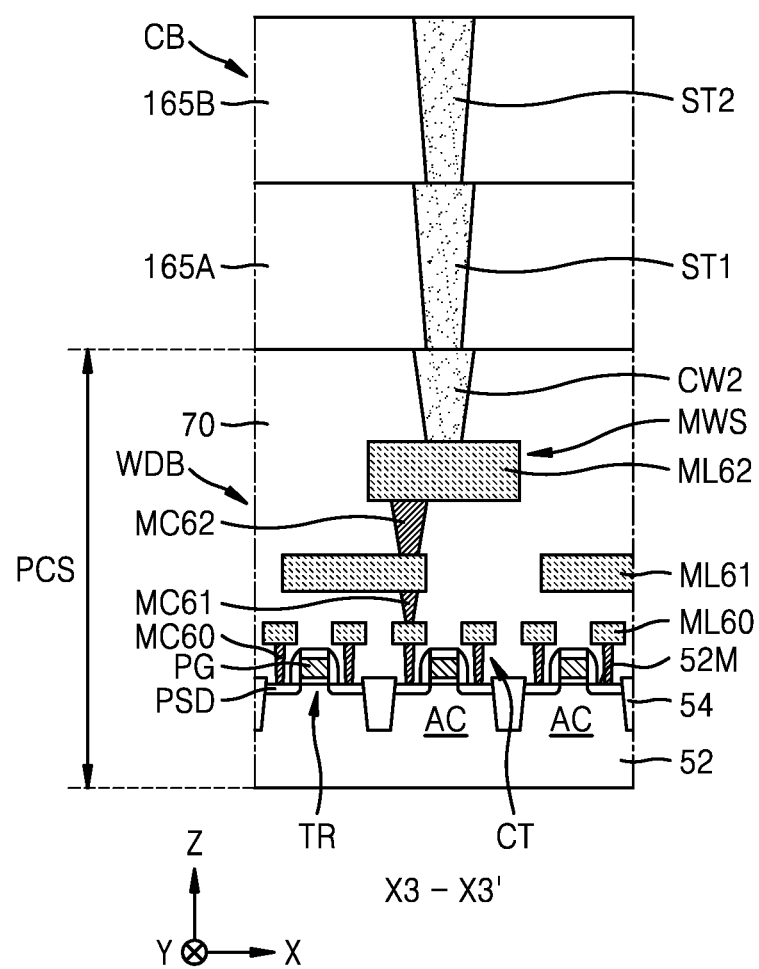

Referring to FIGS. 25A, 25B, and 25C, the first bit lines BL1 are formed on the first level memory cells MC1 and the first insulation layer 165A in the cell array area CA and the cell wire area CB, and the second level memory cells MC2 are formed on the first bit lines BL1 in the cell array area CA.

In an example embodiment, while an etching process of forming the second level memory cells MC2 is performed, some portions of the first bit lines BL1 are exposed to the etching atmosphere during the etching process in the cell array area CA and the cell wire area CB. As a result, some portions of the first bit lines BL1 may include portions having thicknesses less than the maximum thickness of the first bit lines BL1. In another example embodiment, while the etching process of forming the second level memory cells MC2 is performed, the thicknesses of the first bit lines BL1 does not change in the cell array area CA and the cell wire area CB.

Then, the second insulation layer 165B is formed to fill respective gaps between the second level memory cells MC2 in the cell array area CA and cover the first bit lines BL1 and the first insulation layer 165A in the cell wire area CB. The second contact plugs ST2, which are respectively connected to the first contact plugs ST1 are formed by penetrating the second insulation layer 165B in the vertical direction (the Z direction).

Figure 26A:
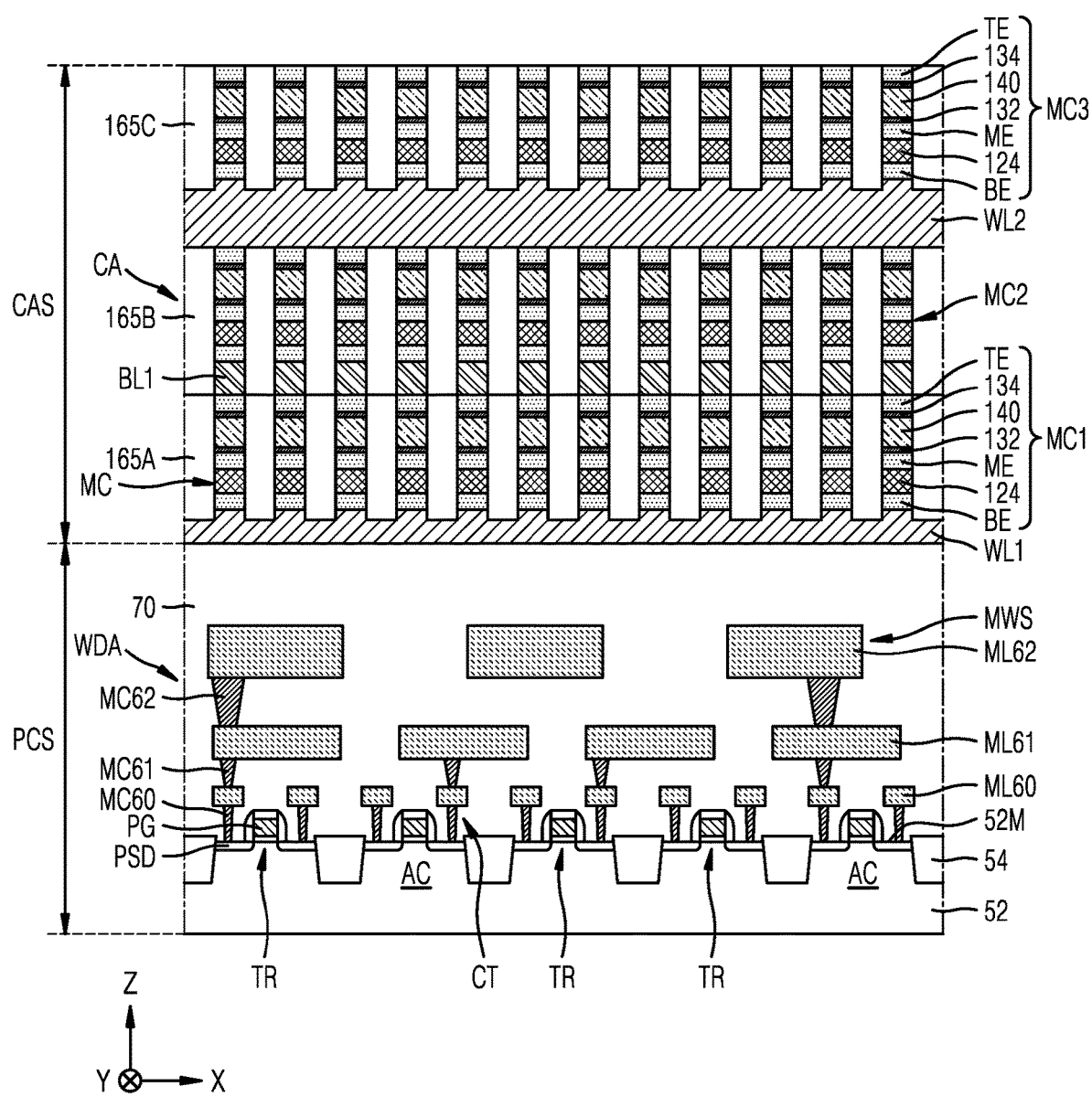
Figure 26B:
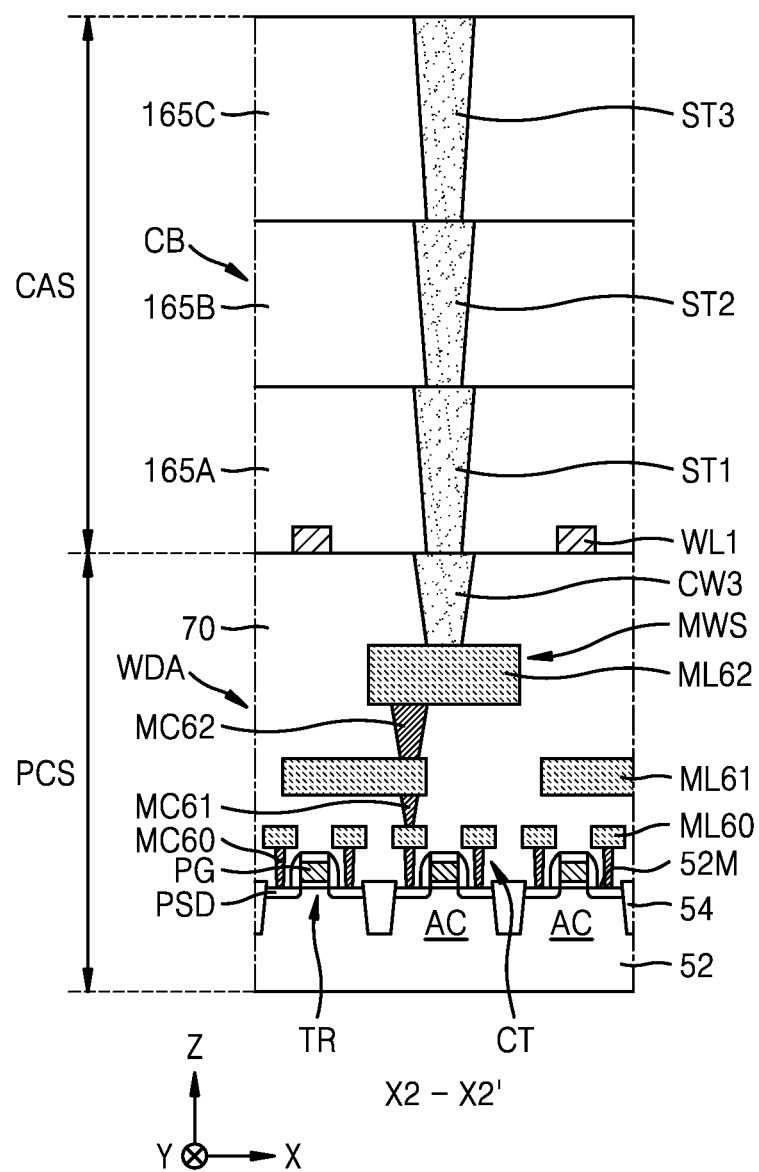
Figure 26C:
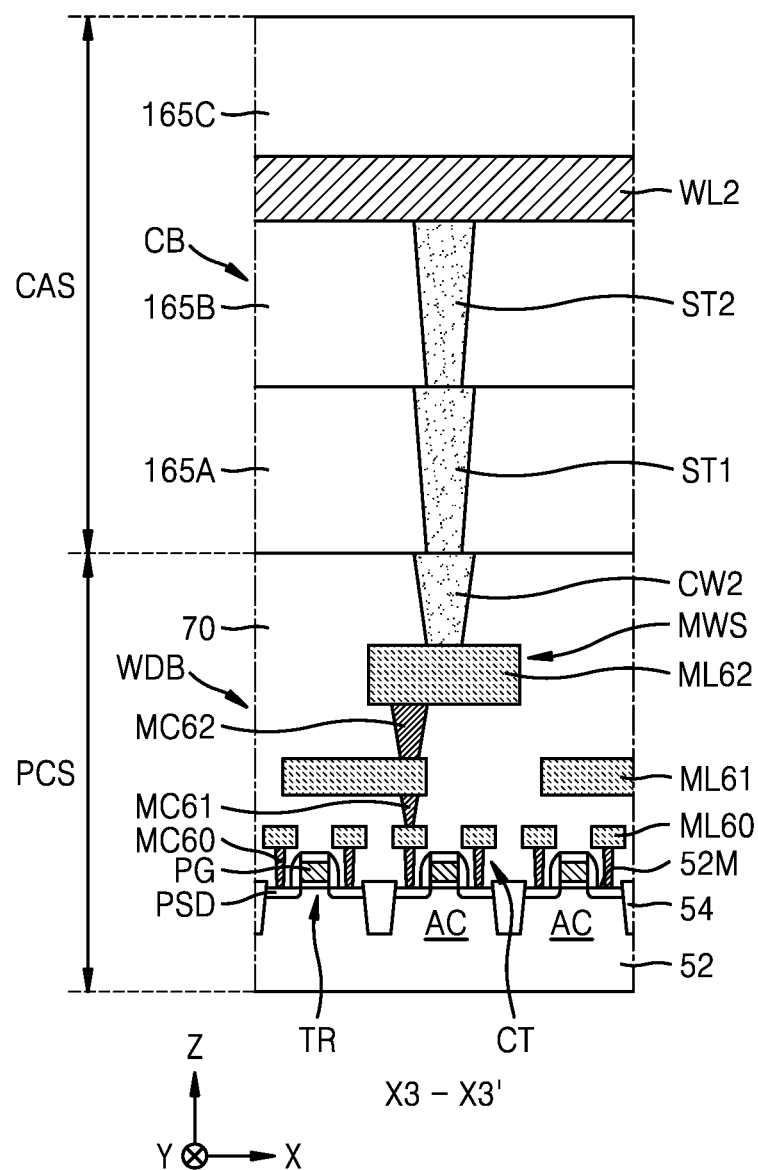

Referring to FIGS. 26A, 26B, and 26C, the second word lines WL2 are formed on the second level memory cells MC2 and the second insulation layer 165B in the cell array area CA and the cell wire area CB, and the third level memory cells MC3 are formed on the second word lines WL2 in the cell array area CA.

In an example embodiment, while an etching process of forming the third level memory cells MC3 is performed, some portions of the second word lines WL2 are exposed to the etching atmosphere during the etching process in the cell array area CA and the cell wire area CB. As a result, as illustrated in FIG. 8, in the cell array area CA, upper levels of some portions of the second word lines WL2 may decrease, and thus, the upper surface of each second word line WL2 may extend unevenly in the first horizontal direction (the X direction). The second word lines WL2 may be exposed to the etching atmosphere in the cell wire area CB. As a result, as illustrated in FIG. 16, the second thickness THB2 of the second word lines WL2 in the cell wire area CB may become less than the maximum thickness THA2 (see FIG. 8) of the second word lines WL2 in the cell array area CA. In another example embodiment, while an etching process of forming the third level memory cells MC3 is performed, the thicknesses of the second word lines WL2 do not change in the cell array area CA and the cell wire area CB.

Then, the third insulation layer 165C is formed to fill respective gaps between the third level memory cells MC3 in the cell array area CA and cover the second word lines WL2 and the second insulation layer 165B in the cell wire area CB. The third contact plugs ST3, which are respectively connected to the second contact plugs ST2 may be formed by penetrating the third insulation layer 165C in the vertical direction (the Z direction).

As illustrated in FIGS. 8 and 11 to 16, the second bit lines BL2 are formed from the results of FIGS. 26A to 26C in the cell array area CA and the cell wire area CB, and the fourth level memory cells MC4 are formed on the second bit lines BL2 in the cell array area CA.

In an example embodiment, while an etching process of forming the fourth level memory cells MC4 is performed, some portions of the second bit lines BL2 are exposed to the etching atmosphere in the cell array area CA and the cell wire area CB. As a result, some portions of the second bit lines BL2 may include portions having thicknesses less than the maximum thickness of the second bit lines BL2. In another example embodiment, while the etching process of forming the fourth level memory cells MC4 is performed, the thicknesses of the second bit lines BL2 do not change in the cell array area CA and the cell wire area CB.

Then, the fourth insulation layer 165D is formed to fill respective gaps between the fourth level memory cells MC4 in the cell array area CA and cover the second bit lines BL2 and the third insulation layer 165C in the cell wire area CB. The fourth contact plugs ST4, which are respectively connected to the third contact plugs ST3 are formed by penetrating the fourth insulation layer 165D in the vertical direction (the Z direction). Then, the third word lines WL3 are formed on the fourth level memory cells MC4 and the fourth insulation layer 165D in the cell array area CA and the cell wire area CB, thus forming the resistive memory device 100.

The exemplary manufacturing method of the resistive memory device 100 of FIGS. 4 to 16 is described with reference to FIGS. 23A to 26C. The resistive memory device 200 of FIGS. 17 to 20, the resistive memory device 300 of FIGS. 21 and 22 may be manufactured based on the descriptions of FIGS. 23A to 26C.

While the inventive concept has been particularly shown and described with reference to embodiments thereof, it will be understood that various changes in form and details may be made therein without departing from the spirit and scope of the following claims.

What is claimed is:
1. A resistive memory device comprising:
a first word line extending in a first horizontal direction in a cell array area and a cell wire area surrounding the cell array area on a substrate;
a second word line arranged on the first word line in a vertical direction and extending in the first horizontal direction in the cell array area and the cell wire area;
a third word line arranged on the second word line in the vertical direction and extending in the first horizontal direction in the cell array area and the cell wire area;
a first bit line extending between the first and second word lines in a second horizontal direction perpendicular to the first horizontal direction in the cell array area and the cell wire area;
a second bit line extending between the second word line and the third word line in the second horizontal direction in the cell array area and the cell wire area;
a plurality of memory cells respectively arranged at intersection points between the word lines and the bit lines in the cell array area,
wherein a thickness of the second word line is greater than a thickness of each of the first word line and the third word line in the vertical direction, and
wherein the first word line and the third word line are respectively connected to a first word line driver through a first wire structure.
2. The resistive memory device of claim 1, further comprising:
the first word line driver arranged in a first circuit area on the substrate; and a second word line driver arranged in a second circuit area separated from the first circuit area on the substrate in the first horizontal direction, wherein the second word line is connected to the second word line driver through a second wire structure.

3. The resistive memory device of claim 1, further comprising a peripheral circuit structure overlapping the cell array area and the cell wire area in the vertical direction, wherein the peripheral circuit structure comprises:

a first circuit area comprising the first word line driver;

a second circuit area separated from the first circuit area in the first horizontal direction and comprising a second word line driver; and a plurality of wire layers arranged in the first circuit area and the second circuit area, wherein the first wire structure comprises a first wire layer selected from among the plurality of wire layers, and wherein the second word line is connected to the second word line driver through a second wire structure comprising a second wire layer selected from among the plurality of wire layers, and the second wire structure is separated from the first wire structure.

4. The resistive memory device of claim 3, wherein the first wire structure comprises:

a first contact plug connected between the first wire layer and the second word line in the first circuit area; and a contact structure comprising a plurality of contact plugs connected in series between the first wire layer and the third word line in the vertical direction in the cell wire area, and wherein the contact structure is separated from the first contact plug in the second horizontal direction.

5. The resistive memory device of claim 3, wherein the first wire structure comprises:

a first contact plug connected between the first wire layer and the first word line in the first circuit area; and a contact structure comprising a plurality of contact plugs connected in series between the first word line and the third word line in the vertical direction in the cell wire area.

6. The resistive memory device of claim 1, further comprising:

the first word line driver arranged in a first circuit area between the substrate and the cell array area and electrically connected to the first word line and the third word line;

a second word line driver arranged in a second circuit area separated from the first circuit area in the first horizontal direction and between the substrate and the cell array area, and configured to be electrically connected to the second word line;

a first bit line driver arranged in a third circuit area between the substrate and the cell wire area and configured to be electrically connected to the first bit line; and a second bit line driver arranged in a fourth circuit area separated from the third circuit area in the second horizontal direction and between the substrate and the cell wire area, and configured to be electrically connected to the second bit line.

7. The resistive memory device of claim 1, wherein the first word line, the second word line, and the third word line comprise a same material.

8. The resistive memory device of claim 1, wherein the first word line and the third word line each comprise a first metal layer having a first resistivity, and the second word line comprises a second metal layer having a second resistivity that is lower than the first resistivity.

9. The resistive memory device of claim 1, wherein the first word line comprises:

a first local portion linearly extending in the cell wire area in the first horizontal direction; and a second local portion linearly extending in the second horizontal direction, and a curved portion in which the first local portion meets the second local portion.

10. The resistive memory device of claim 1, wherein, in the cell wire area, the first word line has a first thickness in the vertical direction, and the third word line has a second thickness that is greater than the first thickness in the vertical direction.

11. A resistive memory device comprising:

a plurality of first word lines arranged in parallel with each other in a cell array area and a cell wire area on a substrate, connected to a first word line driver arranged in a first circuit area on the substrate, and having a first thickness in a vertical direction;

a plurality of second word lines arranged in parallel with each other in the first horizontal direction at locations separated from the plurality of first word lines in a vertical direction, connected to a second word line driver arranged in a second circuit area separated from the first circuit area in the first horizontal direction, and having a second thickness that is greater than the first thickness in the vertical direction;

a plurality of third word lines arranged in parallel with each other in the first horizontal direction at locations separated from the plurality of first word lines in the vertical direction with the plurality of second word lines therebetween, connected to the first word line driver, and having a third thickness that is less than the second thickness in the vertical direction;

a plurality of first bit lines arranged in parallel with each other in a second horizontal direction between the plurality of first word lines and the plurality of second word lines;

a plurality of second bit lines arranged in parallel with each other in the second horizontal direction between the plurality of second word lines and the plurality of third word lines; and a plurality of memory cells arranged at points between the bit lines and the word lines in the cell array area, wherein a selected one of the plurality of first word lines and a selected one of the plurality of third word lines are respectively connected to the first word line driver through a first wire structure.

12. The resistive memory device of claim 11, further comprising a peripheral circuit structure comprising the first circuit area and the second circuit area that are respectively arranged between the substrate and the plurality of first word lines in the vertical direction, wherein the first wire structure comprises:

a first wire layer in the first circuit area;

a first contact plug connected between the first wire layer and the selected first word line; and a contact structure comprising a plurality of contact plugs connected, in the cell wire area, in series between the first wire layer and the selected third word line in the vertical direction, wherein the contact structure is separated from the first contact plug in the second horizontal direction.

13. The resistive memory device of claim 11, further comprising a peripheral circuit structure comprising the first circuit area and the second circuit area respectively arranged between the substrate and the plurality of first word lines in the vertical direction, wherein the first wire structure comprises:
a first wire layer in the first circuit area;
a first contact plug connected between the first wire layer and the selected first word line; and
a contact structure comprising a plurality of contact plugs that are connected, in the cell wire area, in series between the selected first word line and the selected third word line in the vertical direction.

14. The resistive memory device of claim 11, wherein the plurality of first word lines, the plurality of second word lines, and the plurality of third word lines comprise a same material.

15. The resistive memory device of claim 11, wherein the plurality of first word lines and the plurality of third word lines each comprise a first metal layer having a first resistivity, and
the plurality of second word lines each comprise a second metal layer having a second resistivity that is lower than the first resistivity.

16. The resistive memory device of claim 11, wherein the plurality of first word lines have uniform first pitches in the second horizontal direction and linearly extend in the first horizontal direction in some portions of the cell wire area,
at least some of the plurality of first word lines, which are selected from among the plurality of first word lines, comprise at least one curved portion to extend by bypassing a separation space having a length that is greater than the first pitches in the second horizontal direction, in other portions of the cell wire area, and
the plurality of third word lines are connected to the first word line driver through a contact structure penetrating the separation space in the vertical direction.

17. The resistive memory device of claim 11, further comprising a peripheral circuit structure overlapping the cell array area and the cell wire area in the vertical direction and comprising the first circuit area and the second circuit area,
wherein at least part of each of the first circuit area and the second circuit area overlaps the cell array area in the vertical direction, and wherein the peripheral circuit structure further comprises:
a third circuit area comprising a first bit line driver arranged between the substrate and the cell wire area at a location separated from the first circuit area and the second circuit area and configured to be electrically connected to the plurality of first bit lines; and
a fourth circuit area comprising a second bit line driver arranged between the substrate and the cell wire area at a location separated from the third circuit area in the second horizontal direction and configured to be electrically connected to the plurality of second bit lines.

18. A resistive memory device comprising:
a peripheral circuit structure comprising a plurality of circuit areas spaced apart from each other on a substrate; and
a cell array structure arranged on the peripheral circuit structure in a vertical direction and comprising a cell array area comprising a plurality of memory cells and a cell wire area surrounding the cell array area, wherein the cell array structure comprises:
a plurality of first word lines connected to a plurality of first level memory cells, which are selected from among the plurality of memory cells and arranged at a first level of the substrate in the cell array area, and connected to a first word line driver arranged in a first circuit area through the cell wire area, the first circuit area being selected from among the plurality of circuit areas;
a plurality of second word lines arranged at locations separated from the plurality of first word lines in the vertical direction, connected to a plurality of second level memory cells, which are selected from among the plurality of memory cells and arranged at a second level higher than the first level of the substrate, and a plurality of third level memory cells, which are arranged at a third level higher than the second level, in the cell array area, and connected to a second word line driver arranged in a second circuit area selected from among the plurality of circuit areas through the cell wire area, the second circuit area being separated from the first circuit area in the first horizontal direction; and
a plurality of third word lines arranged at locations, which are separated from the plurality of first word lines in the vertical direction with the plurality of second word lines therebetween, connected to a plurality of fourth level memory cells selected from the plurality of memory cells and arranged at a fourth level higher than the third level of the substrate in the cell array area, and connected to the first word line driver through the cell wire area,
wherein thicknesses of the plurality of second word lines are greater than thicknesses of the plurality of first word lines and the plurality of third word lines in the vertical direction, and
wherein a selected one of the plurality of first word lines and a selected one of the plurality of third word lines are respectively connected to the first word line driver through a wire structure.

19. The resistive memory device of claim 18, wherein, in some portions of the cell wire area, the plurality of first word lines have uniform first pitches in the second horizontal direction and linearly extend in the first horizontal direction,
in other portions of the cell wire area, at least some of the plurality of first word lines, which are selected from among the plurality of first word lines, have at least one curved portion to extend by bypassing a separation space having a length that is greater than the first pitches in the second horizontal direction,
wherein the wire structure comprises:
a first wire layer in the first circuit area;
a first contact plug connected between the first wire layer and the selected first word line; and
a contact structure comprising a plurality of contact plugs, which are connected in series between the first wire layer and the selected third word line in the cell wire area in the vertical direction, and penetrating the separation space in the vertical direction.

20. The resistive memory device of claim 18, wherein the wire structure comprises:
a first wire layer in the first circuit area;
a first contact plug connected between the first wire layer and the selected first word line; and
a contact structure comprising a plurality of contact plugs connected in series between the selected first word line and the selected third word line in the vertical direction, in the cell wire area.

* * * * *